(12) United States Patent
Chang et al.

(10) Patent No.: US 11,121,308 B2
(45) Date of Patent: Sep. 14, 2021

(54) SIDEWALL SPACER STRUCTURE FOR MEMORY CELL

(71) Applicant: Taiwan Semiconductor Manufacturing Co., Ltd., Hsin-Chu (TW)

(72) Inventors: Yao-Wen Chang, Taipei (TW); Chung-Chiang Min, Zhubei (TW); Harry-Hak-Lay Chuang, Zhubei (TW); Hung Cho Wang, Taipei (TW); Tsung-Hsueh Yang, Taichung (TW); Yuan-Tai Tseng, Zhubei (TW); Sheng-Huang Huang, Hsinchu (TW); Chia-Hua Lin, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 15 days.

(21) Appl. No.: 16/601,723

(22) Filed: Oct. 15, 2019

(65) Prior Publication Data

US 2021/0111333 A1 Apr. 15, 2021

(51) Int. Cl.
*H01L 43/02* (2006.01)
*H01L 43/12* (2006.01)
*H01L 27/22* (2006.01)

(52) U.S. Cl.
CPC ............ *H01L 43/02* (2013.01); *H01L 27/228* (2013.01); *H01L 43/12* (2013.01)

(58) Field of Classification Search
CPC ... H01L 27/222; H01L 27/226; H01L 27/228; H01L 43/02; H01L 43/12
See application file for complete search history.

(56) References Cited

U.S. PATENT DOCUMENTS

| 2004/0264240 A1 | 12/2004 | Hineman et al. |
| 2012/0288964 A1 | 11/2012 | Gaidis et al. |
| 2016/0380028 A1 | 12/2016 | Sonoda et al. |
| 2019/0088863 A1* | 3/2019 | Lu ...................... H01L 27/2436 |

OTHER PUBLICATIONS

U.S. Appl. No. 16/416,555, filed May 20, 2019.

* cited by examiner

*Primary Examiner* — Marcos D. Pizarro
*Assistant Examiner* — Antonio B Crite
(74) *Attorney, Agent, or Firm* — Eschweiler & Potashnik, LLC

(57) ABSTRACT

Various embodiments of the present disclosure are directed towards an integrated chip including a magnetoresistive random access memory (MRAM) cell over a substrate. A dielectric structure overlies the substrate. The MRAM cell is disposed within the dielectric structure. The MRAM cell includes a magnetic tunnel junction (MTJ) sandwiched between a bottom electrode and a top electrode. A conductive wire overlies the top electrode. A sidewall spacer structure continuously extends along a sidewall of the MTJ and the top electrode. The sidewall spacer structure includes a first sidewall spacer layer, a second sidewall spacer layer, and a protective sidewall spacer layer sandwiched between the first and second sidewall spacer layers. The first and second sidewall spacer layers comprise a first material and the protective sidewall spacer layer comprises a second material different than the first material.

20 Claims, 25 Drawing Sheets

SIDEWALL SPACER STRUCTURE FOR MEMORY CELL

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Magnetoresistive random-access memory (MRAM) is one promising candidate for next generation non-volatile electronic memory due to advantages over current electronic memory. Compared to current non-volatile memory, such as flash memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
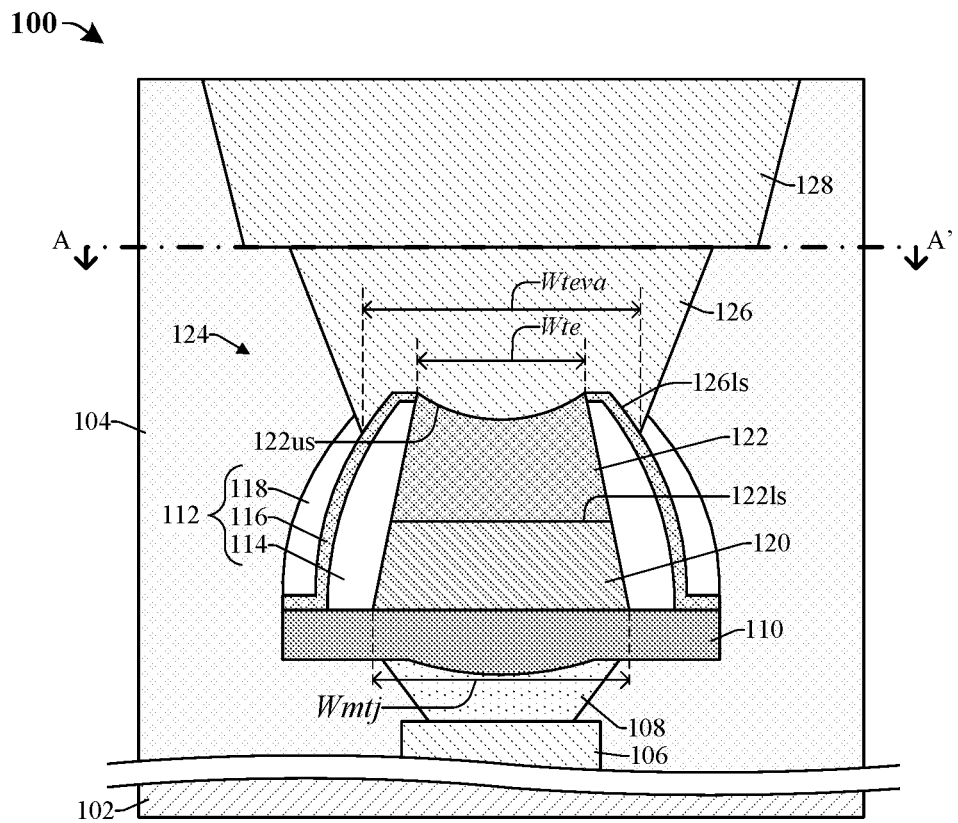
FIG. 1A illustrates a cross-sectional view of some embodiments of an integrated chip having a magnetoresistive random access memory (MRAM) cell comprising a top electrode via overlying a protective sidewall spacer layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

A magnetoresistive random-access memory (MRAM) device comprises a magnetic tunnel junction (MTJ) vertically arranged within a back-end-of-the-line (BEOL) metal stack between a bottom electrode and a top electrode. The MTJ comprises a pinned layer and a free layer, which are vertically separated by a tunnel barrier layer. A magnetic orientation of the pinned layer is static (i.e., fixed), while a magnetic orientation of the free layer is capable of switching between a parallel configuration and an anti-parallel configuration with respect to that of the pinned layer. The parallel configuration provides for a low resistance state that digitally stores data as a first data state (e.g., a logical "0"). The anti-parallel configuration provides for a high resistance state that digitally stores data as a second data state (e.g., a logical "1").

The top electrode of an MRAM device is generally connected to an overlying interconnect wire by way of a top electrode via. The top electrode via may be formed by etching a top electrode via opening into an inter-level dielectric (ILD) layer over the top electrode and subsequently filling the top electrode via opening with a conductive material. The etch needs to persist for a longer period of time than necessary to reach the top electrode so as to ensure dielectric material is fully removed from an upper surface of the top electrode. However, this results in over etching. Residual dielectric material degrades electrical coupling between the top electrode via and the top electrode. Further, the etch may have a higher selectivity for surrounding dielectric material (e.g., dielectric material of a sidewall spacer structure) than the top electrode. Due to this variance in etch selectivity, the over etching may extend along a common sidewall defined by the top electrode and/or the MTJ when the bottom surface of the top electrode via is greater than the top electrode and/or there is a misalignment between the top electrode via and the top electrode. Further, the over etching may reach the tunnel barrier layer of the MTJ and/or the bottom electrode underlying the MTJ. If the over etching reaches the tunnel barrier layer and/or the bottom electrode, the top electrode via may electrical short the pinned and free layers of the MTJ together, thereby leading to failure of the MRAM device.

Additionally, the top electrode via opening may be etched according to a patterned masking layer, such that a size of a top electrode via is generally defined by characteristics of a photolithography system. It has been appreciated that if the top electrode via is too large, the top electrode via opening may extend over sides of the top electrode and/or over sides of the MTJ. Because the size of the top electrode via is relatively small, the top electrode via is generally produced as a feature with a greatest precision on a photomask (e.g., a minimum feature size of a photomask). However, because of this, the top electrode via is subject to critical dimension (CD) tolerances (e.g., a maximum allowed deviation in size from a target of a feature). As the size of MRAM cells continue to decrease, the CD tolerance of the bottom surface of the top electrode vias also increases and makes landing the top electrode via on an underlying top electrode increasingly difficult. The increasing difficulty in landing the top electrode via on the top electrode can lead to over etching that can cause device failure and reduced yield. For example, during formation of the top electrode via opening, the over etching may expose the tunnel barrier layer and/or the pinned magnetic layer of the MTJ. After landing the top electrode via on the top electrode, the top electrode via may directly contact the pinned magnetic layer, thereby shorting the free layer to the pinned layer and rendering the MRAM device inoperable.

The present disclosure, in some embodiments, relates to an integrated chip having an MRAM cell comprising a protective sidewall spacer layer laterally surrounding the MTJ and the top electrode, and further relates to a method for forming the integrated chip. For example, the integrated chip may include a magnetoresistive random access memory (MRAM) device surrounded by an interconnect dielectric structure disposed over a substrate. The MRAM device includes a magnetic tunnel junction (MTJ) between a bottom electrode and a top electrode. A sidewall spacer structure laterally surrounds the MTJ and the top electrode. The sidewall spacer structure includes a protective sidewall spacer layer that comprises a protective material (e.g., a metal oxide and/or a metal nitride), the sidewall spacer structure is disposed between the MTJ and the interconnect dielectric structure. A top electrode via couples the top electrode to an overlying interconnect wire. During fabrication of the MRAM device an etch process is performed to create a top electrode via opening in the interconnect dielectric structure over the top electrode. The protective sidewall spacer layer has a lower etching rate than the top electrode and/or the interconnect dielectric structure, such that sidewalls of the MTJ are not exposed after the etching process. Thus, the protective sidewall spacer layer prevents over etching to the MTJ during the etch process used to define the top electrode via opening, thereby preventing damage to the MTJ.

FIG. 1A illustrates a cross-sectional view of some embodiments of an integrated chip 100 having a magnetoresistive random access memory (MRAM) cell 124 with a top electrode via 126 overlying a protective sidewall spacer layer 116.

The integrated chip 100 includes the MRAM cell 124 disposed within an interconnect dielectric structure 104 over a substrate 102. The MRAM cell 124 includes a magnetic tunnel junction (MTJ) 120 disposed between a top electrode 122 and a bottom electrode 110. In some embodiments, the MTJ 120 includes a pinned layer, a free layer, and a tunnel barrier layer disposed between the free and pinned layers. The MRAM cell 124 is configured to store a data state based upon a resistive value of the MRAM cell 124. For example, the MRAM cell 124 will either store a first data state (e.g., a logical "0") if the MRAM cell 124 has a low resistance state or a second data state (e.g., a logical "1") if the MRARM cell 124 has a high resistance state. During operation, the MTJ 120 can be changed between the low resistance state and the high resistance state through the tunnel magnetoresistance (TMR) effect. A bottom electrode via 108 is arranged below the MRAM cell 124. The bottom electrode via 108 is configured to electrically couple the MRAM cell 124 to a lower interconnect wire 106 disposed within the interconnect dielectric structure 104. The top electrode via 126 overlies the top electrode 122 and an upper interconnect wire 128 overlies the top electrode via 126.

A sidewall spacer structure 112 is disposed between the MTJ 120 and the interconnect dielectric structure 104. The sidewall spacer structure 112 includes a first sidewall spacer layer 114, a second sidewall spacer layer 118, and the protective sidewall spacer layer 116 disposed between the first and second sidewall spacer layers 114, 118. The first and second sidewall spacer layers 114, 118 may, for example, each be or comprise silicon nitride, silicon carbide, or the like. The protective sidewall spacer layer 116 may, for example, be or comprise a metal oxide, such as aluminum oxide, a metal nitride, such as aluminum nitride, or the like. The protective sidewall spacer layer 116 directly contacts a sidewall of the top electrode 122 and continuously extends along the sidewall of the top electrode 122 and a sidewall of the MTJ 120 to an upper surface of the bottom electrode 110. A lower surface 126ls of the top electrode via 126 continuously extends along an upper surface of the protective sidewall spacer layer 116 and an upper surface 122us of the top electrode 122. The upper surface of the protective sidewall spacer layer 116 is disposed vertically above a lower surface 122ls of the top electrode 122.

In some embodiments, the lower surface 126ls of the top electrode via 126 has a width Wteva that is greater than a width Wte of the upper surface 122us of the top electrode 122. Further, in some embodiments, the MTJ 120 has a width Wmtj that is less than the width Wteva and greater than the width Wte. In some embodiments, the width Wte of the top electrode 122 and/or the width Wmtj of the MTJ 120 is smaller than a minimum feature size of a photomask used in a photolithography system (e.g., a photolithography system using 193 nm illumination) to form the top electrode via 126. In such embodiments, a material and/or a layout of the protective sidewall spacer layer 116 allows for the top electrode via 126 to more easily land on the top electrode 122 without landing on the MTJ 120 during fabrication of the MRAM cell 124, thereby preventing over etching that can cause damage to the MRAM cell 124. Further, in some embodiments, during fabrication of the integrated chip 100, the protective sidewall spacer layer 116 functions as an etch stop for an etch process used to form an opening within which the top electrode via 126 is located. This, in turn, prevents the over etching from reaching the MTJ 120 and shorting pinned and free layers of the MTJ 120 together.

Figure 1B:
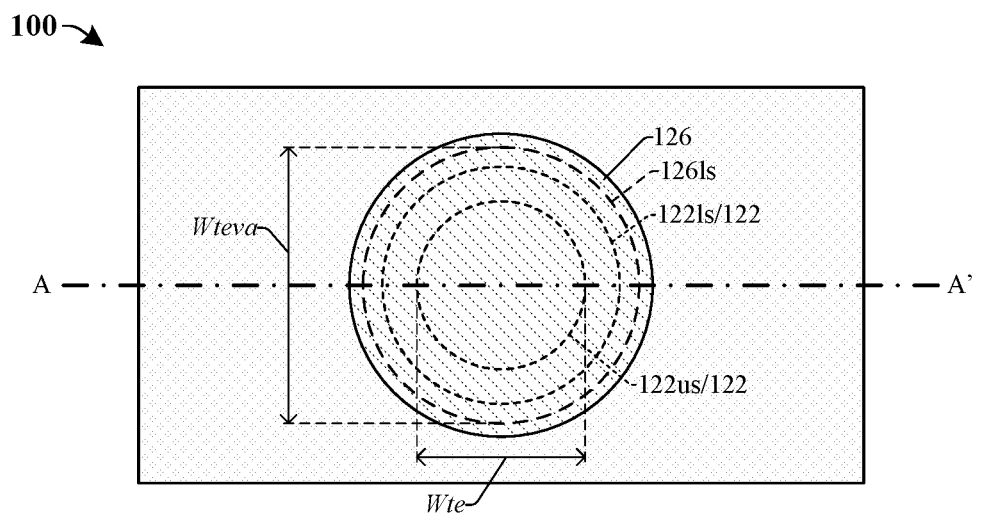
FIG. 1B illustrates a top view of some alternative embodiments of the integrated chip of FIG. 1A according to the cut line A-A'.

FIG. 1B illustrates a top view of alternative embodiments of the integrated chip 100 shown along line A-A' of the cross-sectional view of FIG. 1A.

As illustrated in the top view of FIG. 1B, the upper surface 122us and the lower surface 122ls of the top electrode 122 each have a circular shape. In some embodiments, the upper surface 122us and/or the lower surface 122ls of the top electrode 122 may, for example, have any shape when viewed from above, such as a rectangular shape, a square shape, a rectangular shape with rounded corners (e.g., due to an etch process), or an elliptical shape. Further, the width Wte of the upper surface 122us is less than a width of the lower surface 122ls of the top electrode 122, where the upper surface 122us is laterally spaced between a perimeter of the lower surface 122ls. An upper surface and the lower surface 126ls of the top electrode via 126 each have a circular shape. In some embodiments, the upper surface and/or the lower surface 126ls of the top electrode via 126 may, for example, have any shape when viewed from above, such as a rectangular shape, a square shape, a rectangular shape with rounded corners (e.g., due to an etch process), or an elliptical shape. Further, the width Wteva of the lower surface 126ls is less than a width of the upper surface of the top electrode via 126, where the lower surface 126ls is laterally spaced between a perimeter of the upper surface of the top electrode via 126. In some embodiments, each width (e.g., Wte, Wteva, etc.) of the aforementioned surfaces may correspond to a diameter of that surface.

Figure 2:
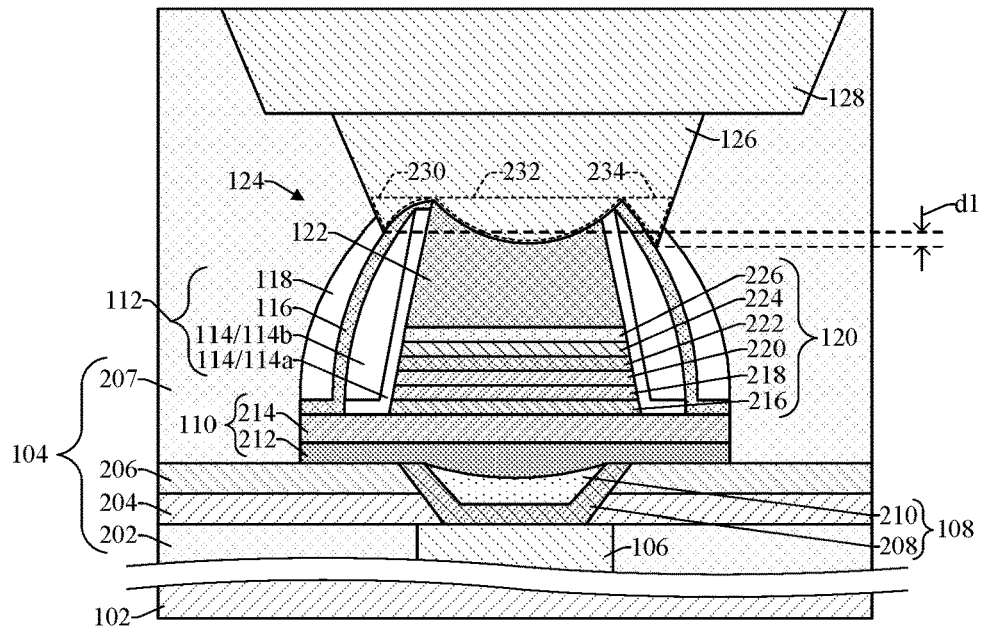
FIGS. 2-4 illustrate cross-sectional views of some alternative embodiments of the integrated chip of FIG. 1A.

FIG. 2 illustrates a cross-sectional view of an integrated chip 200 according to some alternative embodiments of the integrated chip 100 of FIG. 1A.

The integrated chip 200 includes an interconnect dielectric structure 104 over a substrate 102. The interconnect dielectric structure 104 includes multiple inter-level dielectric (ILD) layers 202, 207 and/or multiple dielectric layers 204, 206. In some embodiments, the multiple ILD layers 202, 207 may comprise one or more of silicon dioxide, carbon doped oxide (SiCOH), a flourosilicate glass, or the like. In some embodiments, a first dielectric layer 204 may comprise hydrogen and nitrogen doped carbide (HNDC), silicon carbide, or the like and/or may have a thickness of about 250 Angstroms or some other suitable thickness. In some embodiments, a second dielectric layer 206 may be configured as an etch stop layer and/or may comprise silicon rich oxide, silicon nitride, or the like and/or may have a thickness of about 270 Angstroms or some other suitable thickness. A lower interconnect wire 106 is disposed in a first ILD layer 202 and is electrically coupled to the bottom electrode via 108. The bottom electrode via 108 includes a lower metal layer 210 and a diffusion barrier layer 208.

A bottom electrode 110 is disposed in a second ILD layer 207 and overlies the bottom electrode via 108. The bottom electrode 110 includes a first bottom electrode layer 212 underlying a second bottom electrode layer 214. In some embodiments, the first bottom electrode layer 212 may, for example, be or comprise tantalum, tantalum nitride, or the like and/or may have a thickness of about 100 Angstroms or some other suitable thickness. In some embodiments, the second bottom electrode layer 214 may, for example, be or comprise titanium, titanium nitride, or the like and/or may have a thickness of about 100 Angstroms or some other suitable thickness. In some embodiments, the first bottom electrode layer 212 may, for example, be or comprise a protrusion that extends into an upper surface of the lower metal layer 210.

In some embodiments, the MTJ 120 may, for example, be or comprise multiple memory layers and/or may have a thickness of about 280 angstroms or some other suitable thickness. For example, the MTJ 120 may include a seed layer 216, a first pinned layer 218, a second pinned layer 220, a tunnel barrier layer 222, a free layer 224, and a capping layer 226. In some embodiments, the seed layer 216 may be or comprise one or more of nickel chromium, cobalt iron boron, magnesium, tantalum, ruthenium, tantalum nitride, or the like and/or may have a thickness of about 20 Angstroms or some other suitable thickness. In some embodiments, the first pinned layer 218 and/or the second pinned layer 220 may each be or comprise one or more of iron, cobalt, nickel, iron cobalt, nickel cobalt, cobalt iron boride, iron boride, iron platinum, iron palladium, or the like. In some embodiments, the first pinned layer 218 or the second pinned layer 220 is omitted such that the MTJ 120 comprises a single pinned layer. Further, in some embodiments, the first and second pinned layers 218, 220 function as a single pinned layer for the MTJ 120. In some embodiments, the tunnel barrier layer 222 may be or comprise one or more of magnesium oxide (MgO), aluminum oxide (e.g., $Al_2O_3$), nickel oxide, gadolinium oxide, tantalum oxide, molybdenum oxide, titanium oxide, tungsten oxide, or the like. In some embodiments, the free layer 224 may be or comprise one or more of iron, cobalt, nickel, iron cobalt, nickel cobalt, cobalt iron boride, iron boride, iron platinum, iron palladium, or the like. In some embodiments, the capping layer 226 may be or comprise one or more of ruthenium, magnesium oxide, or the like and/or may have a thickness of about 30 Angstroms or some other suitable thickness.

In some embodiments, the first and second pinned layers 218, 220 each can have a fixed or a "pinned" magnetic orientation that points in the same direction. The free layer 224 can have a variable or "free" magnetic orientation, which can be switched between two or more distinct magnetic polarities that each represents a different data state, such as a different binary state. In some embodiments, if the magnetization directions of the first and second pinned layers 218, 220 and the free layer 224 are in a parallel orientation, it is more likely that charge carriers (e.g., electrons) will tunnel through the tunnel barrier layer 222, such that the MTJ 120 is in a low-resistance state. Conversely, in some embodiments, if the magnetization directions of the first and second pinned layers 218, 220 and the free layer 224 are in an anti-parallel orientation, it is less likely that charge carriers (e.g., electrons) will tunnel through the tunnel barrier layer 222, such that the MTJ 120 is in a high-resistance state. Under normal operating conditions the MTJ 120 may switch between the low-resistance state and the high-resistance state based upon a bias applied between the top electrode via 126 and the bottom electrode via 108.

The top electrode 122 overlies the MTJ 120. The top electrode 122 may be or comprise one or more of tungsten, titanium nitride, tantalum nitride, or the like and/or may have a thickness of about 350 Angstroms or some other suitable thickness. The sidewall spacer structure 112 may continuously surround opposing sidewalls of the top electrode 122 and opposing sidewalls of the MTJ 120. In some embodiments, the opposing sidewalls of the MTJ 120 and/or the opposing sidewalls of the top electrode 122 are defined from a cross-sectional view. For example, if when viewed from above the MRAM cell 124 is circular/elliptical then the opposing sidewalls of the MTJ 120 are a single continuous sidewall when viewed from above, therefore the opposing "sidewalls" of the MTJ 120 refers to the nature of this single continuous sidewall when depicted in in a cross-sectional view. Additionally, if when viewed from above the MRAM cell 124 and/or the top electrode via 126 is circular or elliptical, then any length or width associated with a cross-sectional view of the layers comprising the MRAM cell 124 and/or the top electrode via 126 respectively correspond to diameters of a circle or lengths defined between two vertices on the major axis of an ellipse.

The sidewall spacer structure 112 includes a first sidewall spacer layer 114, a second sidewall spacer layer 118, and the protective sidewall spacer layer 116 disposed between the first and second sidewall spacer layers 114, 118. The first sidewall spacer layer 114 comprises an inner sidewall spacer layer 114a and an outer sidewall spacer layer 114b. The inner sidewalls spacer layer 114a may continuously extends along the outer sidewalls of the top electrode 122 to the outer sidewalls of the MTJ 120. The inner and outer sidewall spacer layers 114a-b may each be or comprise silicon nitride, silicon carbide, or the like.

The upper interconnect wire 128 and the top electrode via 126 are disposed within the second ILD layer 207 and overlie the top electrode 122. In some embodiments, the upper interconnect wire 128 and/or the top electrode via 126 may each be or comprise copper, aluminum, a combination of the forgoing, or the like. The top electrode via 126 comprises a first protrusion 230, a second protrusion 232, and a third protrusion 234. In some embodiments, the first and third protrusions 230, 234 are defined from a cross-sectional view, such that when viewed from above, the first and third protrusions 230, 234 are a single continuous protrusion. The first and third protrusions 230, 234 may each have a triangular shape and may extend through the second sidewall spacer layer 118 to contact outer sidewalls of the protective sidewall spacer layer 116. The second protrusion 232 may have a semi-circular shape and may extend into the top electrode 122. In some embodiments, a bottom point of the first protrusion 230 may be vertically offset a bottom point of the third protrusion 234 by a distance d1. In some embodiments, the difference in height between the bottom point of the first and third protrusions 230, 234 may be due to different etch rates between the second sidewall spacer layer 118, the second ILD layer 207, the top electrode 122 and the protective sidewall spacer layer 116 in an etch process utilized to fabricate the top electrode via 126. However, the top electrode via 126 directly contacts the protective sidewall spacer layer 116 and is laterally and/or vertically offset from the MTJ 120. Thus, the material (e.g., aluminum nitride, aluminum oxide, etc.), the etching rate, and/or shape of the protective sidewall spacer layer 116 allows for the top electrode via 126 to more easily land on the top electrode 122 during fabrication of the MRAM cell 124, while preventing the over etching from causing damage to the MRAM cell 124.

Figure 3:
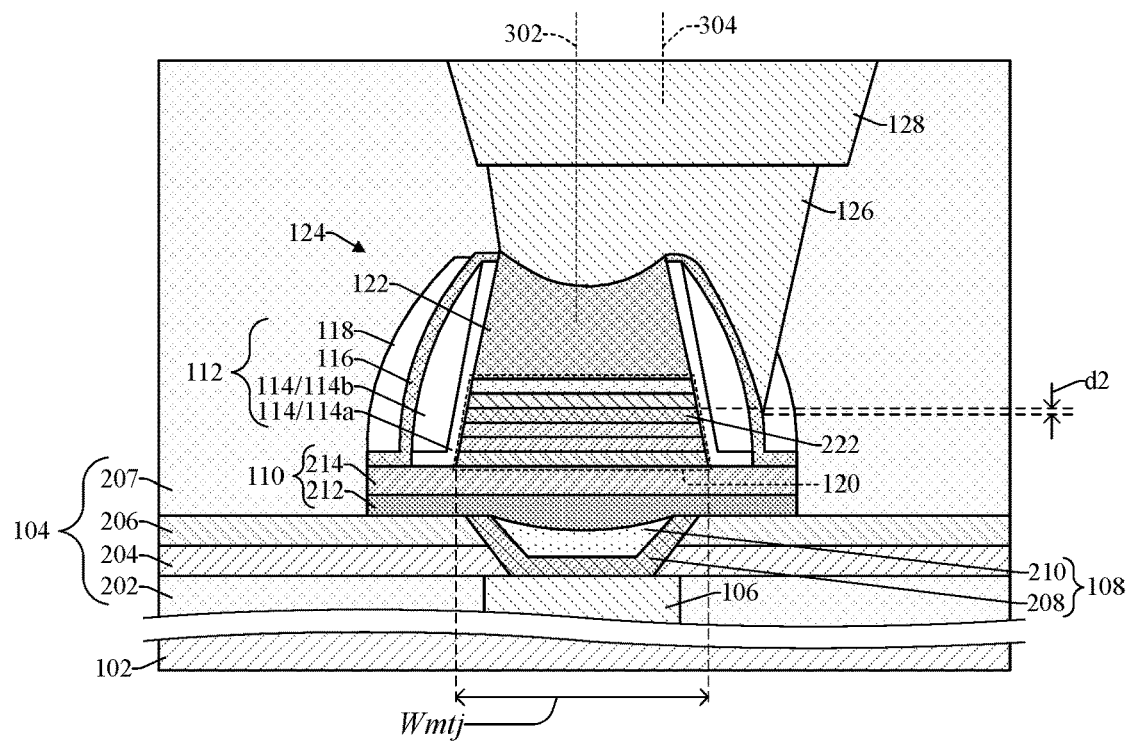

FIG. 3 illustrates a cross-sectional view of an integrated chip 300 according to some alternative embodiments of the integrated chip 100 of FIG. 1A.

In some embodiments, a bottommost point of the top electrode via 126 extends below an upper surface of the tunnel barrier layer 222 by a distance d2. In some embodiments, the distance d2 is non-zero. The top electrode via 126 is laterally offset from the tunnel barrier layer 222 by the protective sidewall spacer layer 116. The MTJ 120 is laterally spaced between opposing sidewalls of the protective sidewall spacer layer 116. In some embodiments, the top electrode via 126 continuously extends along a first sidewall of the opposing sidewalls of the protective sidewall spacer layer 116 and is laterally offset from a second sidewall of the opposing sidewalls of the protective sidewall spacer layer 116. Further, a center of the top electrode 122 and a center of the MTJ 120 are each aligned with a first substantially straight line 302. A center of the top electrode via 126 and/or a center of the upper interconnect wire 128 are/is aligned with a second substantially straight line 304. The second substantially straight line 304 is laterally offset from the first substantially straight line 302 by a non-zero distance in a direction away from the MRAM cell 124. In some embodiments, the offset between the first and second substantially straight lines 302, 304 may be due to misalignment of a photomask over the MTJ 120 (e.g., used in a photolithography system), during fabrication of the MRAM cell 124. This misalignment may occur due to limitations of tools used in the photolithography system and the misalignment may increase as a width Wmtj of the MTJ 120 decreases. In some embodiments, the width Wmtj is less than 75 nanometers. In such embodiments, the protective sidewall spacer layer 116 may prevent an over etch into dielectric layers (e.g., the first sidewall spacer layer 114 and/or the tunnel barrier layer 222) around and/or within the MTJ 120. Thus, the MTJ 120 is not exposed during the over etch process and the top electrode via 126 is laterally offset from layers of the MTJ 120 by a non-zero distance. Therefore, the protective sidewall spacer layer 116 facilitates scaling down a size of the MRAM cell 124. In some embodiments, a maximum width of the tunnel barrier layer 222 is less than a minimum width of the top electrode via 126. In such embodiments, the maximum width of the tunnel barrier layer 222 may be about 75 nanometers or less, or within a range of about 70 to 80 nanometers.

Figure 4:
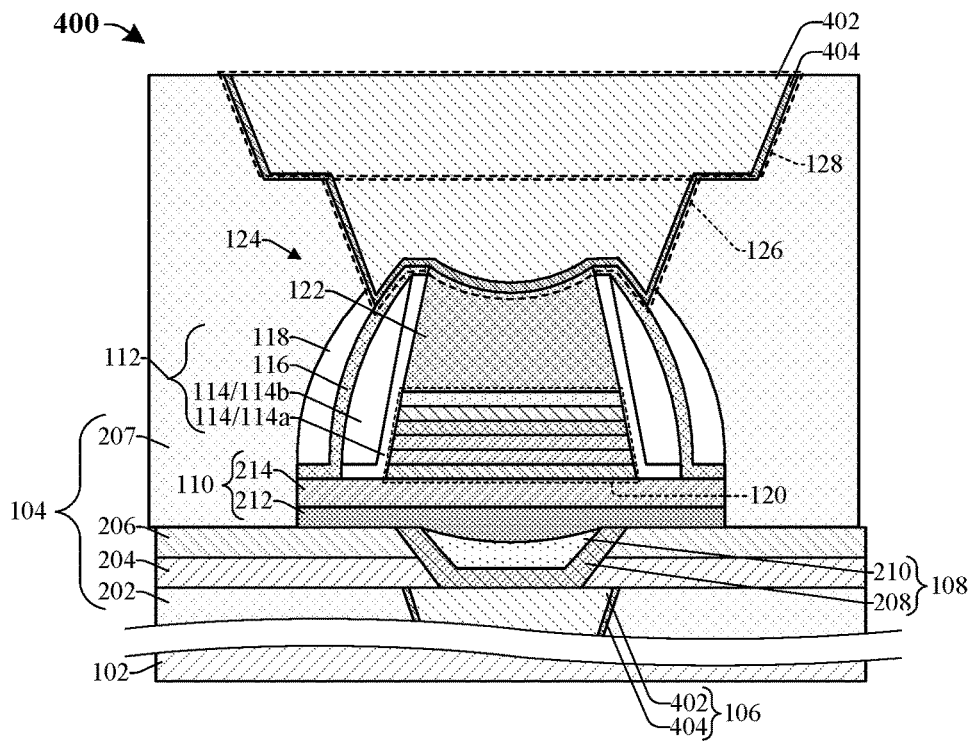

FIG. 4 illustrates a cross-sectional view of an integrated chip 400 according to some alternative embodiments of the integrated chip 100 of FIG. 1A.

As illustrated in FIG. 4, the top electrode via 126 and the upper interconnect wire 128 are a continuous conductive structure. The top electrode via 126 and the upper interconnect wire 128 are comprised of a conductive body 402 surrounded by a conductive liner 404. In some embodiments, the conductive body 402 may, for example, be or comprise aluminum, copper, an alloy of the aforementioned, or the like. In further embodiments, the conductive liner 404 may, for example, be or comprise tungsten, titanium, or the like. The conductive body 402 may be a continuous conductive structure extending to a point below the top electrode 122 and the conductive liner 404 may continuously extend along opposing sidewalls and a lower surface of the conductive body 402. In yet further embodiments, the lower interconnect wire 106 may comprise a conductive body 402 and a conductive liner 404.

Figure 5:
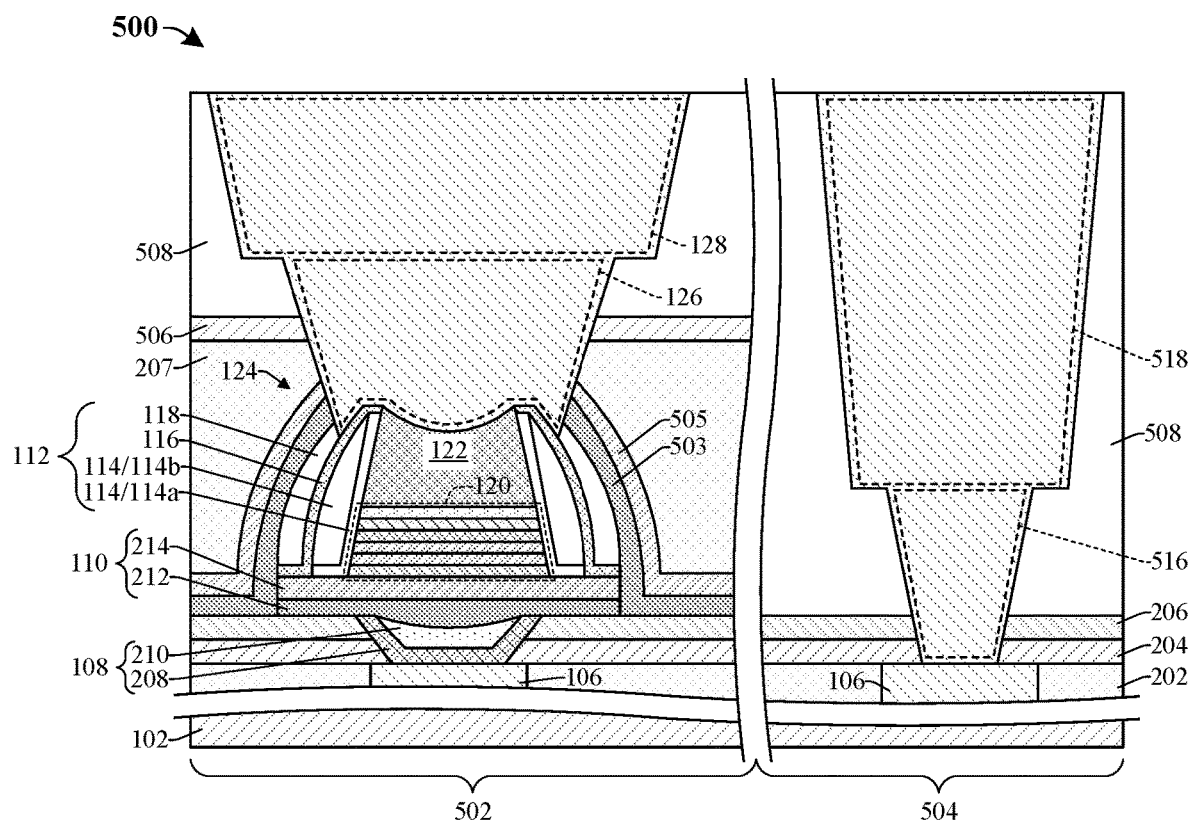
FIG. 5 illustrates a cross-sectional view of some embodiments of an integrated chip having an embedded memory region with an MRAM cell laterally adjacent to a logic region.

FIG. 5 illustrates a cross-sectional view of some embodiments of an integrated chip 500 comprising an embedded memory region 502 with an MRAM cell 124 laterally adjacent to a logic region 504.

As illustrated in the cross-sectional view of FIG. 5, a dielectric protection layer 506 overlies the second ILD layer 207 in the embedded memory region 502. The dielectric protection layer 506 may, for example, be or comprise hydrogen and nitrogen doped carbide (HNDC), silicon carbide, or the like and/or may have a thickness of about 300 Angstroms or some other suitable thickness. A third ILD layer 508 overlies the dielectric protection layer 506. The third ILD layer 508 may, for example, be or comprise an extreme low-k dielectric material, or another suitable dielectric material. A first outer sidewall spacer layer 503 overlies and wraps around the sidewall spacer structure 112, and a second outer sidewall spacer layer 505 overlies the first outer sidewalls spacer layer 503. The first outer sidewall spacer layer 503 may, for example, be or comprise silicon oxy-carbide, silicon carbide, or the like and/or may have a thickness of about 150 Angstroms or some other suitable thickness. The second outer sidewall spacer layer 505 may, for example, be or comprise silicon oxy-nitride, silicon nitride, or the like and/or may have a thickness of about 200 Angstroms or some other suitable thickness.

In the logic region 504, a lower interconnect wire 106 is disposed in the first ILD layer 202. The first and second dielectric layers 204, 206 overlie the lower interconnect wire 106. Further, the third ILD layer 508 overlies the second dielectric layer 206. A conductive via 516 overlies the lower interconnect wire 106, and a conductive wire 518 overlies the conductive via 516. In some embodiments, the conductive via and wire 516, 518 may, for example, each be or comprise copper, aluminum, aluminum copper, or the like. In further embodiments, the conductive via and wire 516, 518 may be a single continuous conductive structure. In some embodiments, the lower interconnect wire 106 disposed within the logic region 504 is electrically coupled to one or more semiconductor devices (e.g., transistors) disposed over and/or within the substrate 102. The one or more semiconductor devices may, for example, be metal-oxide-semiconductor field-effect transistors (MOSFETs).

Figure 6:
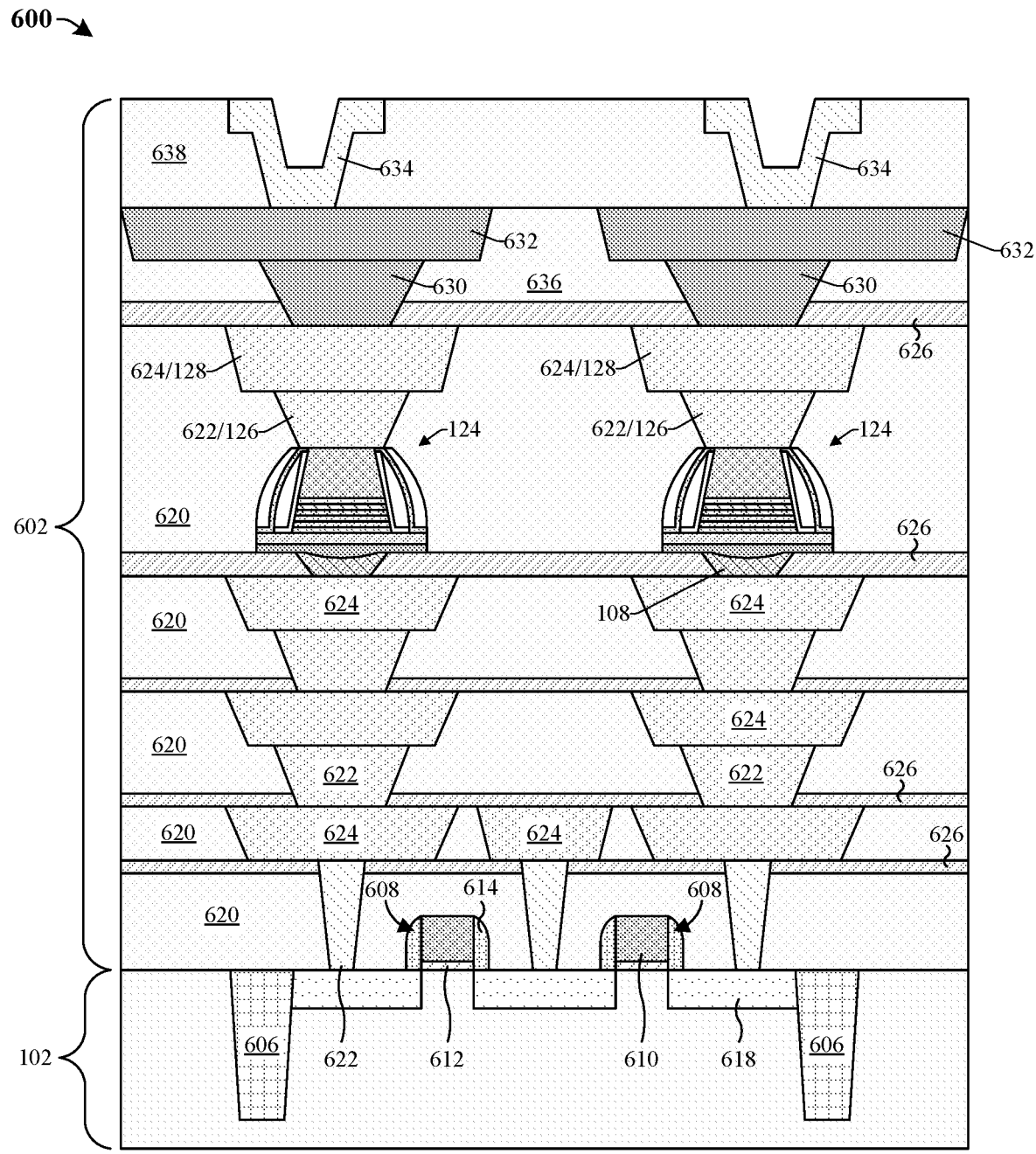
FIG. 6 illustrates a cross-sectional view of some embodiments of an integrated chip having an MRAM cell disposed within an interconnect structure and overlying a semiconductor substrate.

FIG. 6 illustrates a cross-sectional view of some embodiments of an integrated chip 600 having MRAM cells 124 disposed within an interconnect structure 602 and overlying a substrate 102.

As illustrated in FIG. 6, the interconnect structure 602 overlies the substrate 102. The substrate 102 may, for example, be a bulk substrate (e.g., a bulk silicon substrate) or a silicon-on-insulator (SOI) substrate. One or more shallow trench isolation (STI) regions 606 are disposed within the substrate 102 and transistors 608 are spaced between the STI regions 606. The STI regions 606 may be or include an oxide-filled trench within the substrate 102.

The transistors 608 extend parallel to one another and include transistor gates 610, transistor dielectric layers 612, transistor sidewall spacer structures 614, and source/drain regions 618. The transistor gates 610 are arranged over corresponding transistor dielectric layers 612 and are lined by corresponding transistor sidewalls spacer structures 614. The source/drain regions 618 are embedded within the surface of the substrate 102 between the transistor gates 610 and the STI regions 606. The transistor gates 610 may, for example, be or comprise doped polysilicon or a metal, such as titanium nitride or tantalum nitride, or the like. The transistor dielectric layers 612 may, for example, be or comprise an oxide, such as silicon dioxide, another suitable dielectric, or the like. The transistor sidewall spacer structures 614 may, for example, be or comprise silicon nitride, silicon carbide, or the like. The source/drain regions 618 correspond to, for example, doped regions of the substrate 102.

The interconnect structure 602 overlies the transistors 608. The interconnect structure 602 includes a plurality of ILD layers 620, a plurality of etch stop layers 626, a plurality of conductive wires 624, a plurality of conductive vias 622, redistribution wires 632, redistribution vias 630, passivation layers 636, 638, and bond pad structures 634. A pair of MRAM cells 124 are disposed within the ILD layers 620 and is stacked between layers of conductive wires 624. The MRAM cells 124 are as described in FIGS. 1A and 2. The conductive wires 624 and the conductive vias 622 may, for example, each be or comprise aluminum, copper, aluminum copper, or the like. The conductive vias and wires 622, 624 are configured to electrically couple the MRAM cells 124 to the transistors 608. The conductive vias 622 directly on the MRAM cells 124 may be configured as the top electrode via 126 of FIG. 1A. The ILD layers 620 may, for example, be or comprise silicon oxide, a low-k dielectric material, or the like. The plurality of etch stop layers 626 may, for example, each be or comprise silicon nitride, silicon carbide, or the like. The redistribution vias and wires 630, 632 overlie the MRAM cells 124 and are configured to electrically couple the MRAM cells 124 to overlying bond pad structures 634. The bond pad structures 634 may be configured to electrically couple the integrated chip 600 to another integrated chip (not shown).

Figure 7:
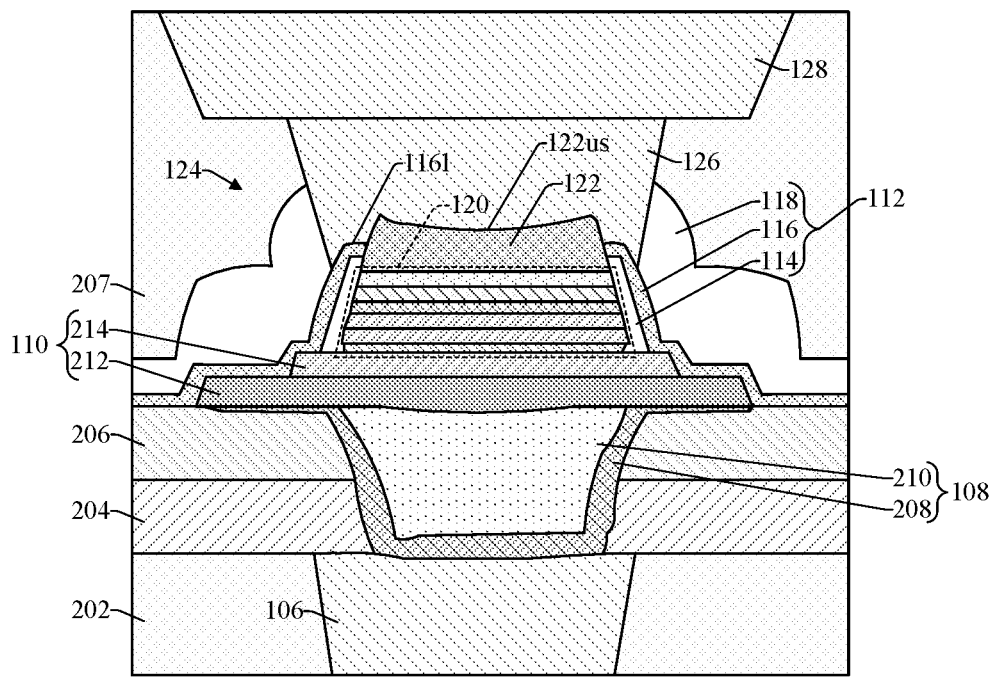
FIGS. 7-10C illustrate various cross-sectional views of some alternative embodiments of the integrated chip of FIG. 1A.

FIG. 7 illustrates a cross-sectional view of an integrated chip 700 according to some alternative embodiments of the integrated chip 100 of FIG. 1A, in which the top electrode via 126 directly contacts a ledge 116l of the protective sidewall spacer layer 116. In some embodiments, the ledge 116l of the protective sidewall spacer layer 116 continuously wraps around the top electrode 122 and is disposed vertically below an upper surface 122us of the top electrode 122.

Figure 8:
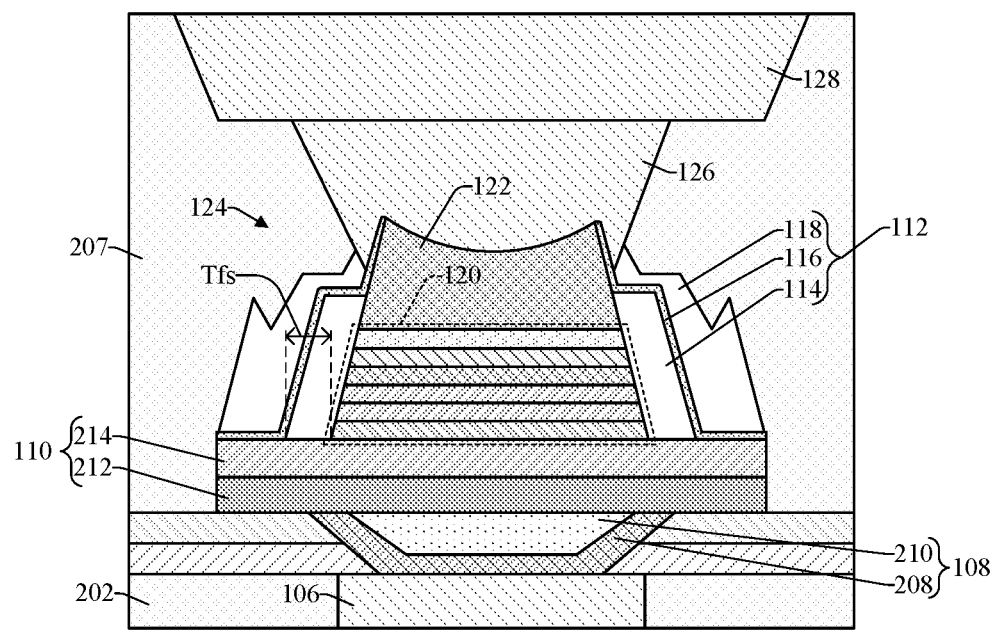

FIG. 8 illustrates a cross-sectional view of an integrated chip 800 according to some alternative embodiments of the integrated chip 100 of FIG. 1A, in which an upper surface of the second sidewall spacer layer 118 comprises a plurality of protrusions. Additionally, a thickness Tfs of the first sidewall spacer layer 114, as measured from a sidewall of the MTJ 120 is within a range of about 100 to 130 Angstroms.

Figure 9A:
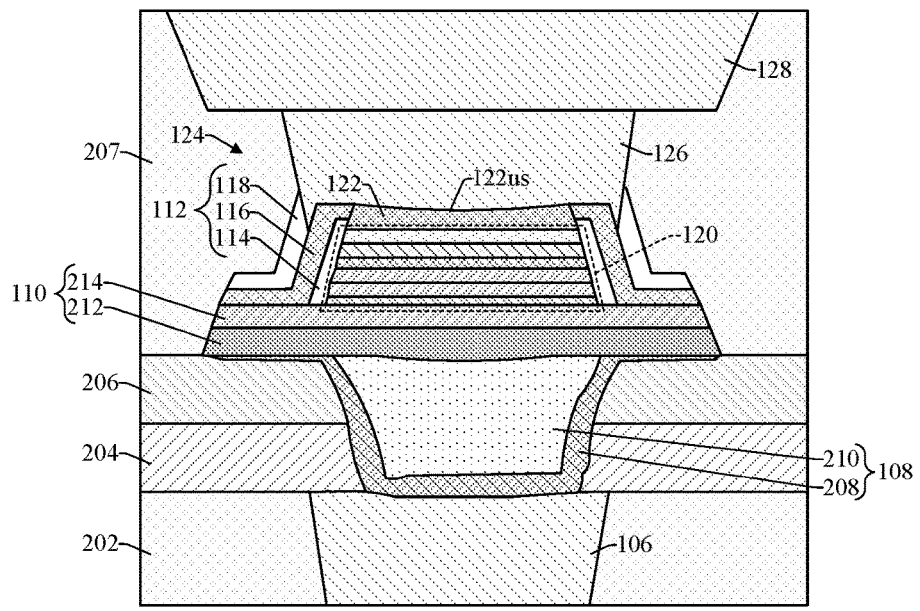

FIG. 9A illustrates a cross-sectional view of an integrated chip 900a according to some alternative embodiments of the integrated chip 100 of FIG. 1A, in which an upper surface 122us of the top electrode 122 is disposed below a top surface of the protective sidewall spacer layer 116.

Figure 9B:
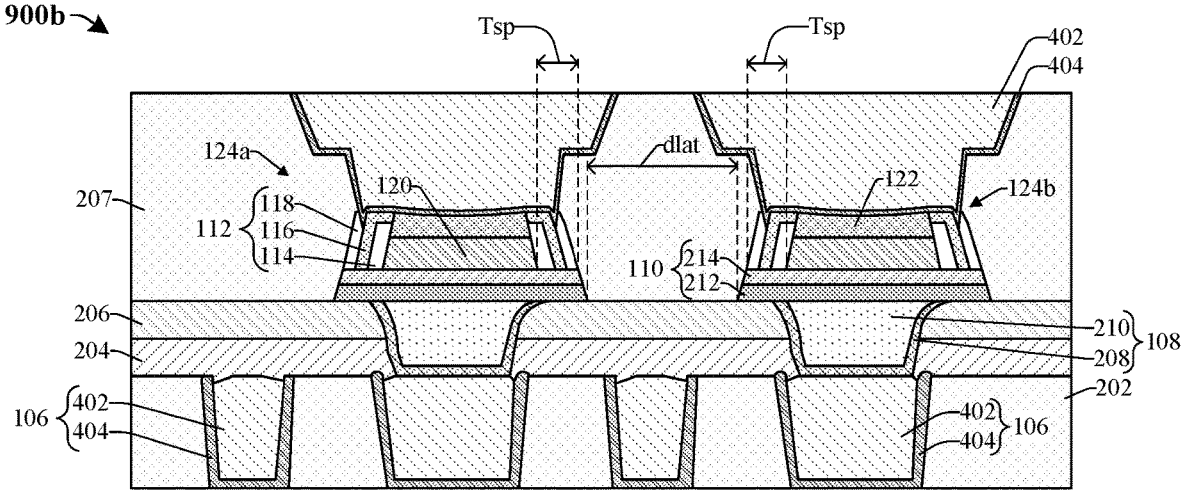

FIG. 9B illustrates a cross-sectional view of an integrated chip 900b according to some alternative embodiments of the integrated chip 100 of FIG. 1A, in which a first MRAM cell 124a and a second MRAM cell 124b are disposed within the second ILD layer 207 and are laterally adjacent to one another. The first and second MRAM cells 124a-b may each be configured as the MRAM cell 124 is illustrated and described in FIG. 1A.

In some embodiments, a thickness Tsp of the sidewall spacer structure 112 of the first and second MRAM cells 124a-b, as measured from an outer sidewall of the MTJ 120, is less than about 400 Angstroms. The thickness Tsp of the sidewall spacer structure 112 may be a maximum thickness of the sidewall spacer structure 112. In some embodiments, if the thickness Tsp is greater than 400 Angstroms, then a lateral distance dlat between the first and second MRAM cells 124a-b is reduced, thus a process for forming the second ILD layer 207 around the first and second MRAM cells 124a-b may be adversely affected. For example, because the lateral distance dlat is reduced, the second ILD layer 207 may not be uniformly deposited between and/or over the first and second MRAM cells 124a-b (e.g., due to fabrication tool limitations), resulting in gaps and/or voids in the second ILD layer 207. This, in part, may lead to conductive structures and/or layers electrically shorting together (e.g., due to delamination of adjacent layers and/or structures), thereby causing device failure. In further embodiments, if the thickness Tsp is substantially less than 400 Angstroms (e.g., the thickness Tsp is less than 50 Angstroms), then the sidewall spacer structure 112 may not properly protect sidewalls of the MTJ 120 and/or sidewalls of the top electrode 122 during device fabrication.

Figure 10A:
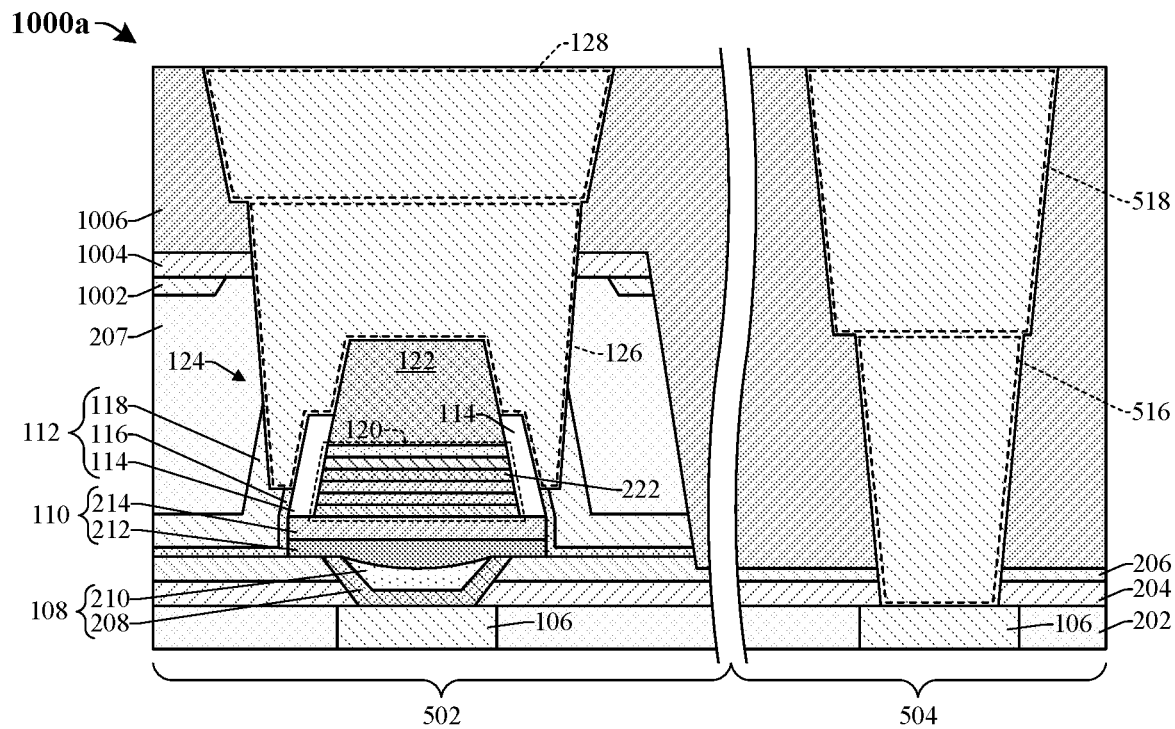

FIG. 10A illustrates a cross-sectional view of an integrated chip 1000a according to some alternative embodiments of the integrated chip 100 of FIG. 1A, in which a first dielectric protection layer 1002 overlies the second ILD layer 207 within the embedded memory region 502. A second dielectric protection layer 1004 overlies the first dielectric protection layer 1002. Further, an upper ILD layer 1006 continuously extends from above the second dielectric protection layer 1004 within the embedded memory region 502 to over the second dielectric layer 206 within the logic region 504. In some embodiments, the first dielectric protection layer 1002 may, for example, be or comprise silicon nitride, silicon carbide, or the like. In further embodiments, the second dielectric protection layer 1004 may, for example, be or comprise silicon oxycarbide, or another suitable dielectric material. In yet further embodiments, the upper ILD layer 1006 may, for example, be or comprise a low-k dielectric material, silicon oxycarbide, or another suitable dielectric material.

Figure 10B:
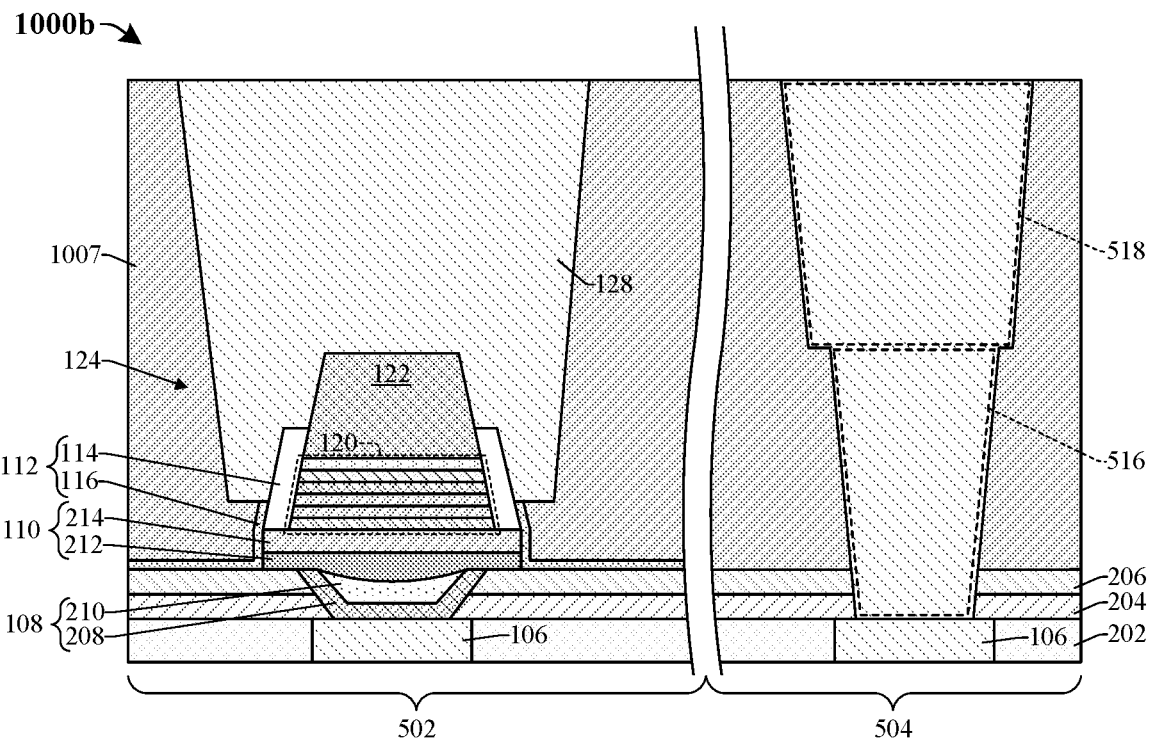

FIG. 10B illustrates a cross-sectional view of an integrated chip 1000b according to some alternative embodiments of the integrated chip 100 of FIG. 1A, in which an upper ILD structure 1007 continuously extends from the MRAM cell 124 to over the lower interconnect wire 106 disposed within the logic region 504. In some embodiments, the upper ILD structure 1007 may, for example, be or comprise a low-k dielectric material, silicon oxycarbide, or another suitable dielectric material. In further embodiments, the upper interconnect wire 128 directly contacts the top electrode 122.

Figure 10C:
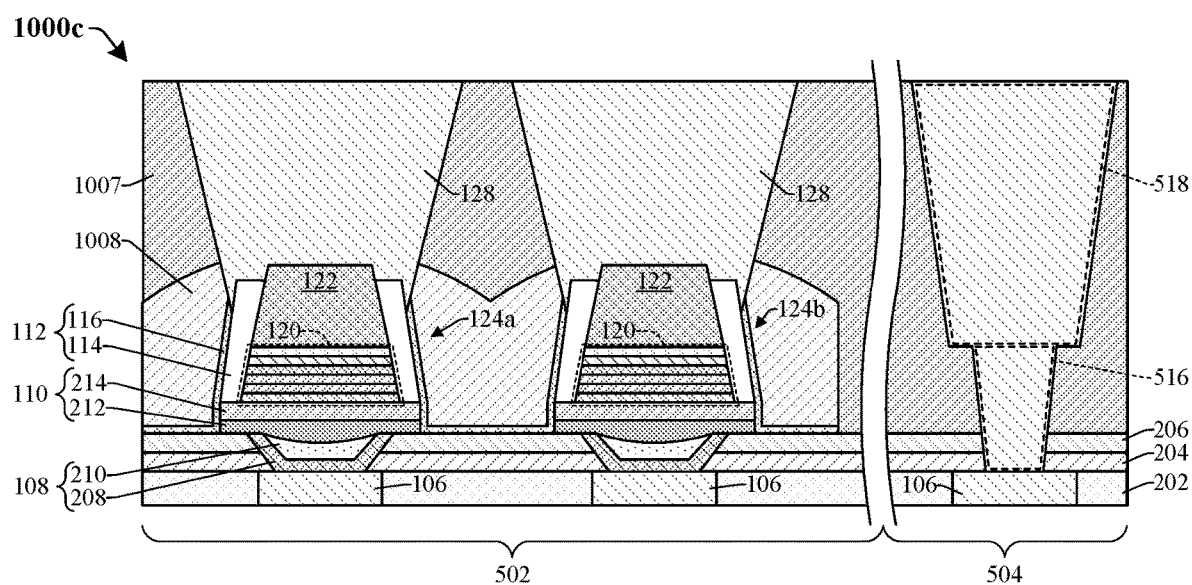

FIG. 10C illustrates a cross-sectional view of an integrated chip 1000c according to some alternative embodiments of the integrated chip 100 of FIG. 1A, in which a dielectric fill layer 1008 is disposed around a first MRAM cell 124a and a second MRAM cell 124b. Further, an upper ILD structure 1007 is disposed over the first and second MRAM cells 124a-b. In some embodiments, an upper interconnect wire 128 is disposed above each of the first and second MRAM cells 124a-b and directly contact the top electrode 122. In some embodiments, the dielectric fill layer 1008 may, for example, be or comprise tetra-ethyl-orthosilicate (TEOS), (e.g., plasma enhanced TEOS, low particle TEOS, etc.), an oxide (e.g., silicon oxide, silicon dioxide, etc.), a nitride, or the like. In further embodiments, the upper ILD structure 1007 may, for example, be or comprise a low-k dielectric material, silicon oxycarbide, or another suitable dielectric material.

FIGS. 11-17, 18A, 18B, 19, 20, 21A, 21B, and 22 illustrate various views 1100-1700, 1800a, 1800b, 1900, 2000, 2100a, 2100b, and 2200 of some embodiments of a first method of forming an integrated chip having an MRAM cell comprising a top electrode via overlying a protective sidewall spacer layer. Although the various views 1100-1700, 1800a, 1800b, 1900, 2000, 2100a, 2100b, and 2200 shown in FIGS. 11-17, 18A, 18B, 19, 20, 21A, 21B, and 22 are described with reference to a method, it will be appreciated that the structures shown in FIGS. 11-17, 18A, 18B, 19, 20, 21A, 21B, and 22 are not limited to the first method but rather may stand alone separate of the method. Furthermore, although FIGS. 11-17, 18A, 18B, 19, 20, 21A, 21B, and 22 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 11:
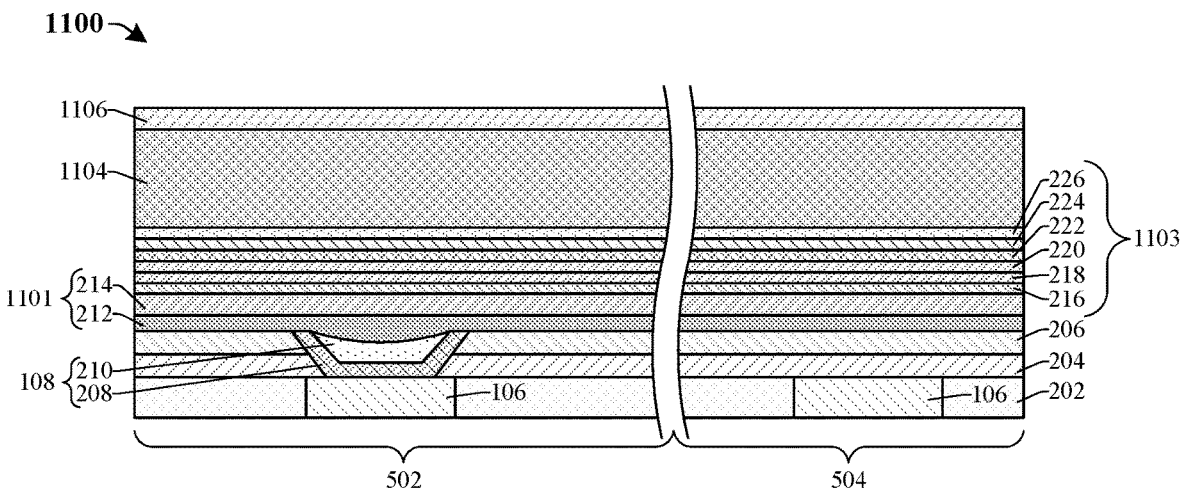
FIGS. 11-17, 18A, 18B, 19, 20, 21A, 21B, and 22 illustrate various views of some embodiments of a first method of forming an integrated chip having an MRAM cell comprising a top electrode via overlying a protective sidewall spacer layer.

As shown in cross-sectional view 1100 of FIG. 11, a first inter-level dielectric (ILD) layer 202 is formed over a substrate (not shown). Lower interconnect wires 106 are formed in an embedded memory region 502 and a logic region 504. In some embodiments, the lower interconnect wires 106 may, for example, be or comprise copper, aluminum, tungsten, a combination of the foregoing, or the like. A first dielectric layer 204 is formed over the first ILD layer 202 and a second dielectric layer 206 is formed over the first dielectric layer 204. In some embodiments, the first dielectric layer 204 may, for example, be or comprise hydrogen and nitrogen doped carbide (HNDC), silicon carbide, or the like and/or may be formed to a thickness of about 250 Angstroms. In some embodiments, the second dielectric layer 206 may, for example, be or comprise silicon rich oxide, silicon nitride, or the like and/or may be formed to a thickness of about 270 Angstroms. The first and/or second dielectric layers 204, 206 may each be formed by performing a deposition process, for example, physical vapor deposition (PVD), chemical vapor deposition (CVD), atomic layer deposition (ALD), or another suitable deposition process. After deposition, the first and/or second dielectric layers 204, 206 are selectively patterned to define a bottom electrode via opening extending through the first and/or second dielectric layers 204, 206 to an underlying lower interconnect wire 106 in the embedded memory region 502.

In some embodiments, a bottom electrode via 108 is formed within the bottom electrode via opening and contacts the lower interconnect wire 106. In some embodiments, the bottom electrode via 108 may be formed by forming a diffusion barrier layer 208 within the bottom electrode via opening. The diffusion barrier layer 208 may be configured to prevent diffusion between adjacent layers. In some embodiments, the diffusion barrier layer 208 may be configured as a conductive liner and/or may comprise a glue layer configured to increase adhesion between adjacent layers. A lower metal layer 210 is formed over the diffusion barrier layer 208 within the bottom electrode via opening. The diffusion barrier layer 208 and/or the lower metal layer 210 may, for example, be deposited by CVD, PVD, sputtering, electroless plating, or another suitable growth or deposition process. A planarization process (e.g., a chemical mechanical planarization (CMP) process) may subsequently be performed. In some embodiments, the lower metal layer 210 may, for example, be or comprise tantalum, titanium, or the like. The diffusion barrier layer 208 may, for example, be or comprise titanium nitride, tantalum nitride, or the like.

Also illustrated in FIG. 11, a bottom electrode stack 1101 is formed over the second dielectric layer 206 and the bottom electrode via 108. The bottom electrode stack 1101 may include a first bottom electrode layer 212 underlying a second bottom electrode layer 214. In some embodiments, the first and/or second bottom electrode layers 212, 214 may each be formed by, for example, CVD, PVD, sputtering, or another suitable deposition or growth process. After forming the bottom electrode stack 1101, a memory cell stack 1103 is formed over the bottom electrode stack 1101. The memory cell stack 1103 includes a seed layer 216, a first pinned layer 218, a second pinned layer 220, a tunnel barrier layer 222, a free layer 224, and a capping layer 226. The layers of the memory cell stack 1103 may each be formed, for example, by CVD, PVD, sputtering, electroless plating, or another suitable deposition or growth process. After forming the memory cell stack 1103, a top electrode layer 1104 is formed over the memory cell stack 1103 and a top electrode capping layer 1106 is formed over the top electrode layer 1104. In some embodiments, the top electrode layer 1104 and/or the top electrode capping layer 1106 may each be formed, for example, by CVD, PVD, sputtering, electroless plating, or another suitable deposition or growth process.

Figure 12:
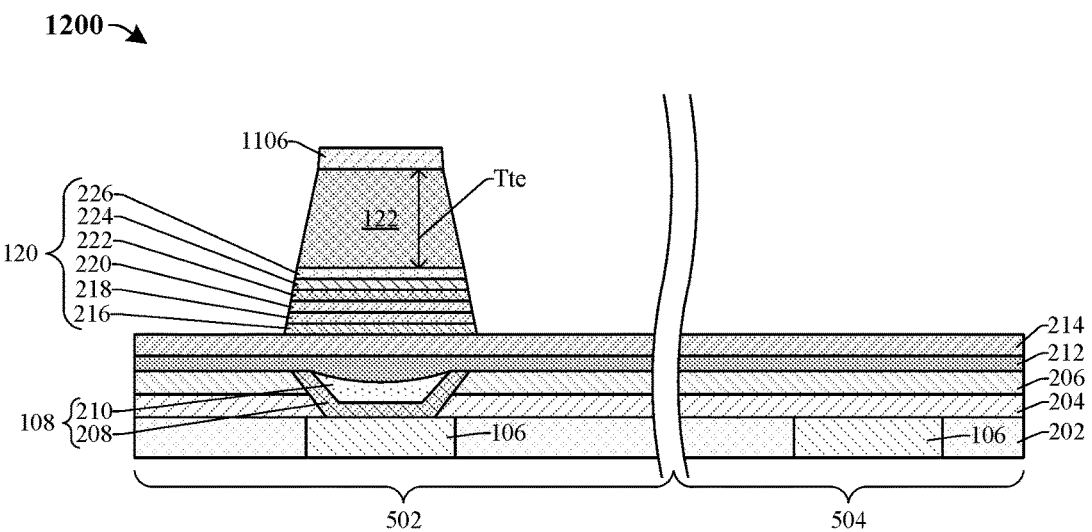

As shown in cross-sectional view 1200 of FIG. 12, a patterning process is performed to define a magnetic tunnel junction (MTJ) 120 and a top electrode 122. In some embodiments, the patterning process includes: 1) forming a masking layer (not shown) over the top electrode capping layer 1106; 2) exposing unmasked regions of layers underlying the masking layer to one or more etchants, thereby defining the MTJ 120 and the top electrode 122; and 3) performing a removal process to remove the masking layer. In some embodiments, the second bottom electrode layer 214 may act as an etch stop layer during the aforementioned patterning process. In some embodiments, the top electrode 122 is formed to a thickness Tte of about 350 Angstroms or some other suitable thickness.

Figure 13:
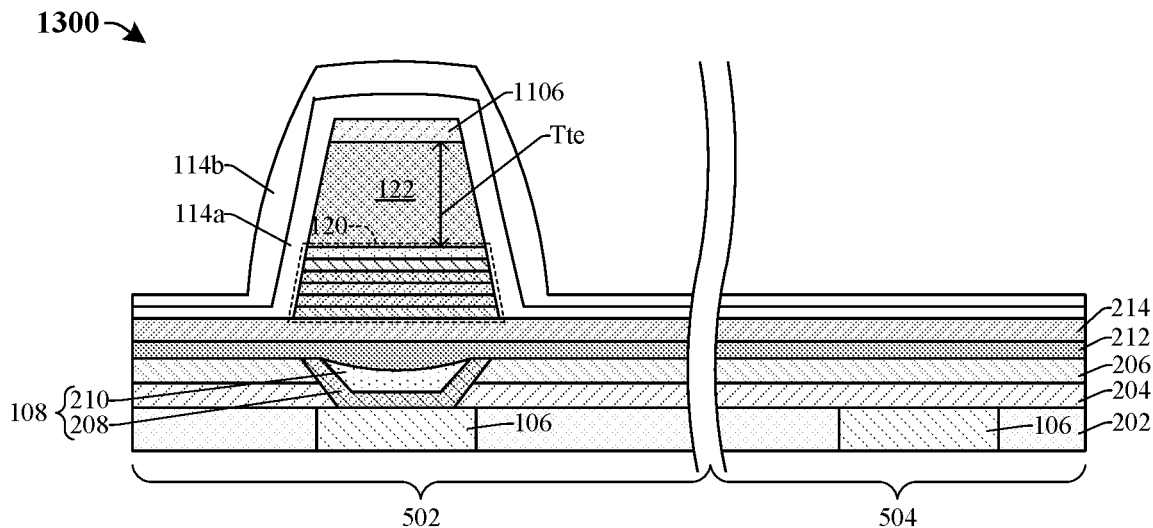

As shown in cross-sectional view 1300 of FIG. 13, an inner sidewall spacer layer 114a is formed over and around the top electrode 122 and the MTJ 120. Subsequently, an outer sidewall spacer layer 114b is formed over the inner sidewall spacer layer 114a. In some embodiments, the inner and/or outer sidewall spacer layers 114a, 114b each may be or comprise silicon nitride, silicon oxy-nitride, or the like. The inner and/or outer sidewall spacer layers 114a, 114b may each be formed by, for example, CVD, PVD, ALD, or another suitable deposition or growth process. In further embodiments, the inner and outer sidewall spacer layers 114a, 114b each have a top surface disposed above a top surface of the top electrode 122.

Figure 14:
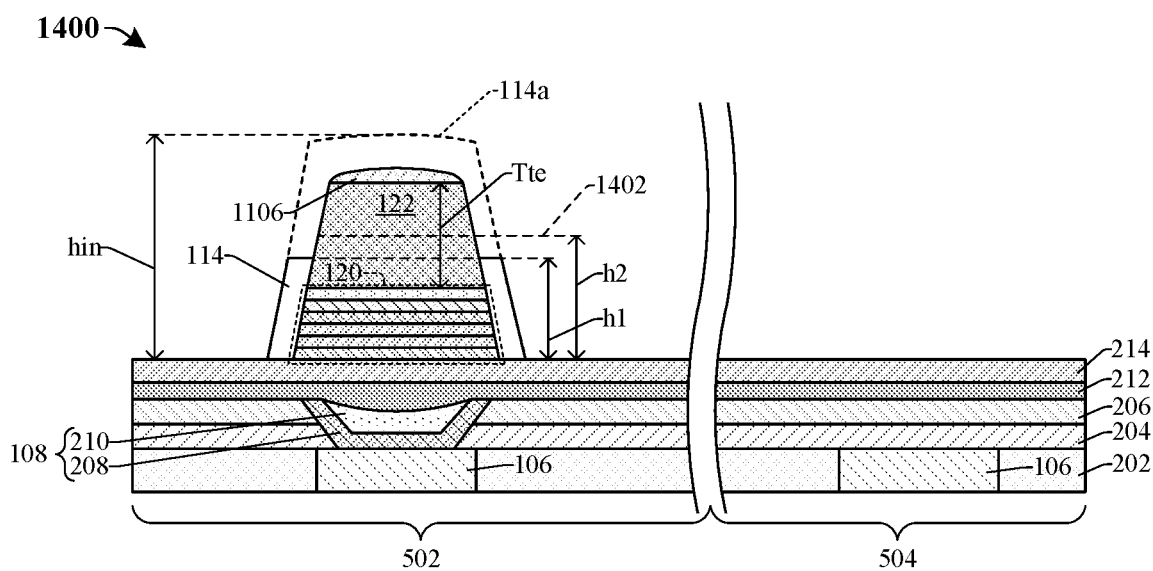

As shown in cross-sectional view 1400 of FIG. 14, a patterning process is performed on the inner and outer sidewall spacer layers (114a, 114b of FIG. 13), thereby defining a first sidewall spacer layer 114. For ease of illustration, an upper portion of the inner sidewall spacer layer 114a is illustrated in FIG. 14 by a dashed-line, it may be appreciated that the upper portion of the inner sidewall spacer layer 114a is removed during the patterning process. In some embodiments, the patterning process may completely remove the outer sidewall spacer layer (114b of FIG. 13). In further embodiments, the patterning process may leave at least a portion of the outer sidewall spacer layer (114b of FIG. 13), see for example FIGS. 2-5. In some embodiments, the patterning process may include performing a blanket etch process, a wet etch process, a dry etch process, a combination of the foregoing, or another suitable etch process.

The first sidewall spacer layer 114 is configured to protect outer sidewalls of the MTJ 120 and is formed to have a height h1, as measured from a top surface of the second bottom electrode layer 214. In some embodiments, a substantially straight line 1402 is disposed at a midpoint of the top electrode 122. For example, in some embodiments, if the thickness Tte of the top electrode 122 is about 350, then the substantially straight line 1402 is disposed at a point of the top electrode 122 that is approximately 175 Angstroms above a bottom surface of the top electrode 122. The patterning of the inner and outer sidewall spacer layers 114a, 114b is performed in such a manner that a top surface of the first sidewall spacer layer 114 is disposed at or below the midpoint point of the top electrode 122. In such embodiments, the top surface of the first sidewall spacer layer 114 is above a top surface of the MTJ 120.

Further, as illustrated in FIG. 14, the patterning process performed on the inner and outer sidewall spacer layers (114a, 114b of FIG. 13) is configured to reduce an initial height hin of the inner sidewall spacer layer 114a to the height h1 (i.e., over etch the inner sidewall spacer layer 114a). For example, a ratio of the height h1 to the initial height hin (e.g., h1:hin) is about 1:1.8, 1:2, 1:2.4, or within a range of about 1:1.8-2.4. In some embodiments, if the ratio of the height h1 to the initial height hin is less than 1:1.8, then the top surface of the first sidewall spacer layer 114 may be disposed above the midpoint of the top electrode 122 (e.g., the top surface of the first sidewall spacer layer 114 is vertically above the substantially straight line 1402). This may result in damage to adjacent layers during subsequent process steps (e.g., the patterning process of FIG. 18A may over etch and remove a vertical segment of the protective sidewall spacer 116 contacting the top electrode 122), thereby reducing a process yield of the MTJ 120. In further embodiments, if the ratio of the height h1 to the initial height hin is greater than 1:2.4, then the top surface of the first sidewall spacer layer 114 may be disposed below the top surface of the MTJ 120, this may prevent an ability of the first sidewall spacer layer 114 to protect the outer sidewalls of the MTJ 120.

Figure 15:
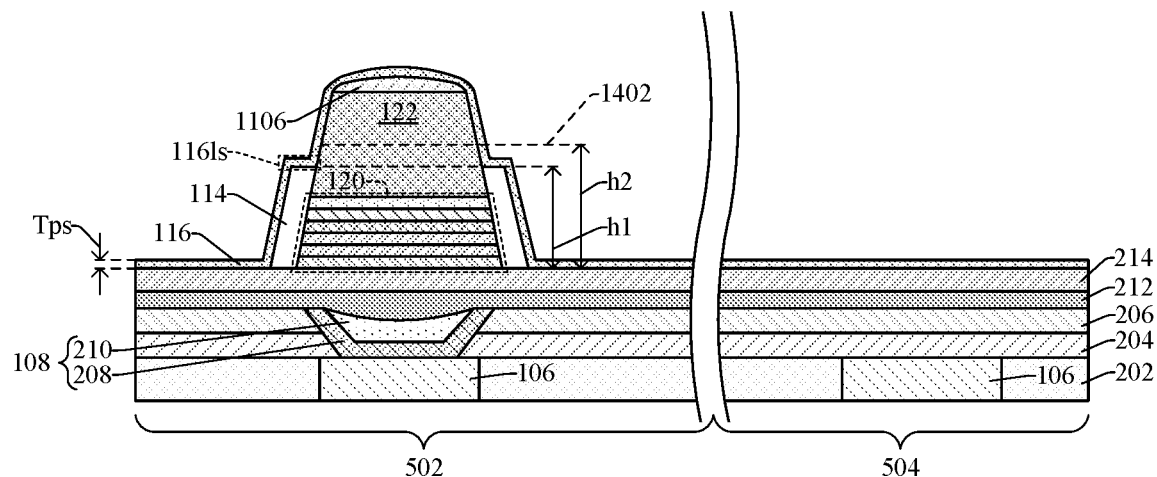

As shown in cross-sectional view 1500 of FIG. 15, a protective sidewall spacer layer 116 is formed over the top electrode 122, the MTJ 120, and the first sidewall spacer layer 114. In some embodiments, the protective sidewall spacer layer 116 may, for example, be or comprise a metal oxide, such as aluminum oxide (e.g., $AlO_x$, where x is a positive whole number), or the like and/or may be formed to a thickness within a range of about 30 to 50 Angstroms. In further embodiments, the protective sidewall spacer layer 116 may, for example, be or comprise a metal nitride, such as aluminum nitride, or the like and/or may be formed to a thickness within a range of about 40 to 100 Angstroms. Other thicknesses and/or materials is/are, however, amenable for the protective sidewall spacer layer 116. The protective sidewall spacer layer 116 may, for example, be deposited by CVD, PVD, ALD, or another suitable deposition process. Further, because the top surface of the first sidewall spacer layer 114 has the height h1, as described in FIG. 14, a lateral segment 116ls of the protective sidewall spacer layer 116 is disposed above the top surface of the MTJ 120. This may increase a structural integrity of the protective sidewall spacer layer 116. Thus, by controlling the over etching of the inner sidewall spacer layer (114a of FIG. 14), the protective sidewall spacer layer 116 may be formed in such a manner to prevent damage in subsequent processing steps (e.g., see FIG. 18A). In some embodiments, the protective sidewall spacer layer 116 is configured as an etch stop layer. In such embodiments, during an etch process (e.g., the one or more etch processes of FIG. 21A) used to form an overlying top electrode via (126 of FIG. 22), the etch process has a low selectivity for the protective sidewall spacer layer 116 relative to adjacent dielectric materials (e.g., the first sidewall spacer layer 116).

Figure 16:
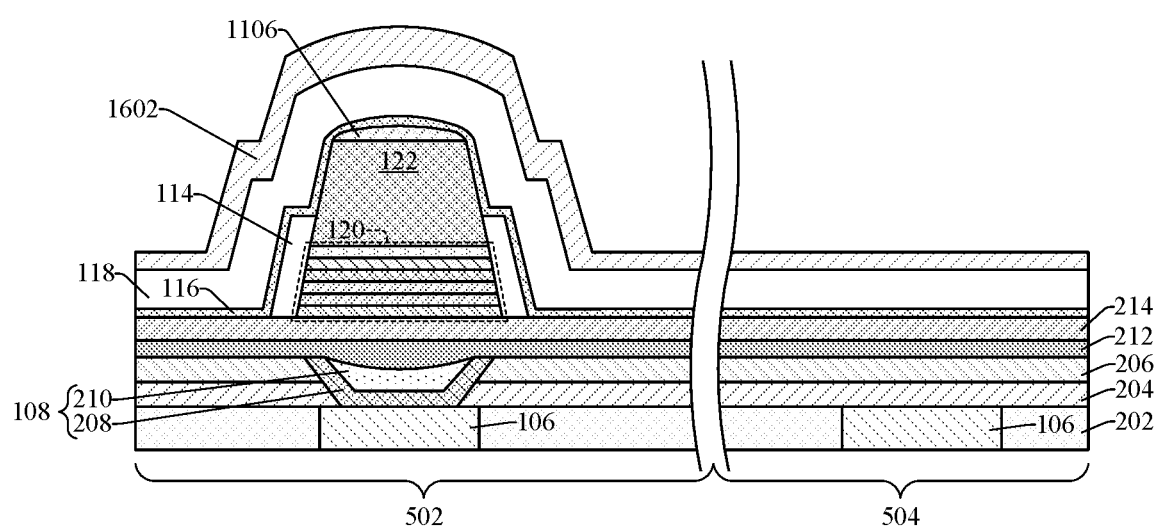

As shown in cross-sectional view 1600 of FIG. 16, a second sidewall spacer layer 118 is formed over the protective sidewall spacer layer 116, and an upper dielectric layer 1602 may be formed over the second sidewall spacer layer 118. In some embodiments, the upper dielectric layer 1602 may be configured to protect underlying layers during subsequent processing steps (e.g., during an etching process). In some embodiments, the second sidewall spacer layer 118 may, for example, be or comprise silicon nitride or some other suitable material and/or may be formed to a thickness of about 260 Angstroms or some other suitable thickness. In some embodiments, the second sidewall spacer layer 118 is or comprise a same material as the first sidewall spacer layer 114. The upper dielectric layer 1602 may, for example, be or comprise an oxide, such as silicon dioxide, another suitable oxide or some other suitable material and/or may be formed to a thickness of about 150 Angstroms or some other suitable thickness. In some embodiments, the second sidewall spacer layer 118 and/or the upper dielectric layer 1602 may each, for example, be deposited by CVD, PVD, ALD, or another suitable deposition process.

Figure 17:
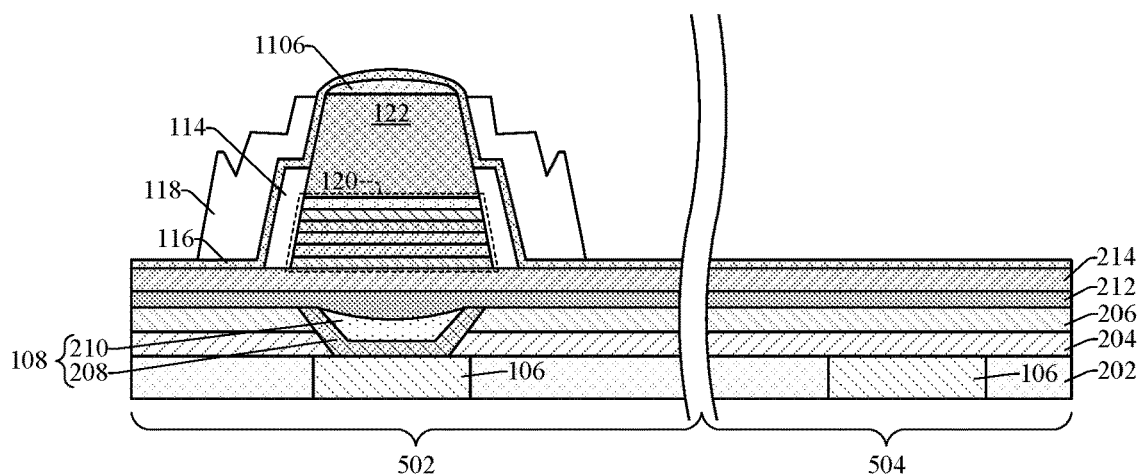

As shown in cross-sectional view 1700 of FIG. 17, a patterning process is performed on the second sidewall spacer layer 118 and the upper dielectric layer (1602 of FIG. 16), thereby exposing an upper surface of the protective sidewall spacer layer 116. In some embodiments, the patterning process includes, for example, performing a wet etch, a dry etch, a blanket etch, or another suitable etch process. In some embodiments, during the patterning process of FIG. 17, the protective sidewall spacer layer 116 is configured as an etch stop layer. In such embodiments, the patterning process has a low selectivity for the protective sidewall spacer layer 116 relative to the second sidewall spacer layer 118 and the upper dielectric layer (1602 of FIG. 16), such that the protective sidewall spacer layer 116 remains over the top electrode capping layer 1106 after the patterning process.

Figure 18A:
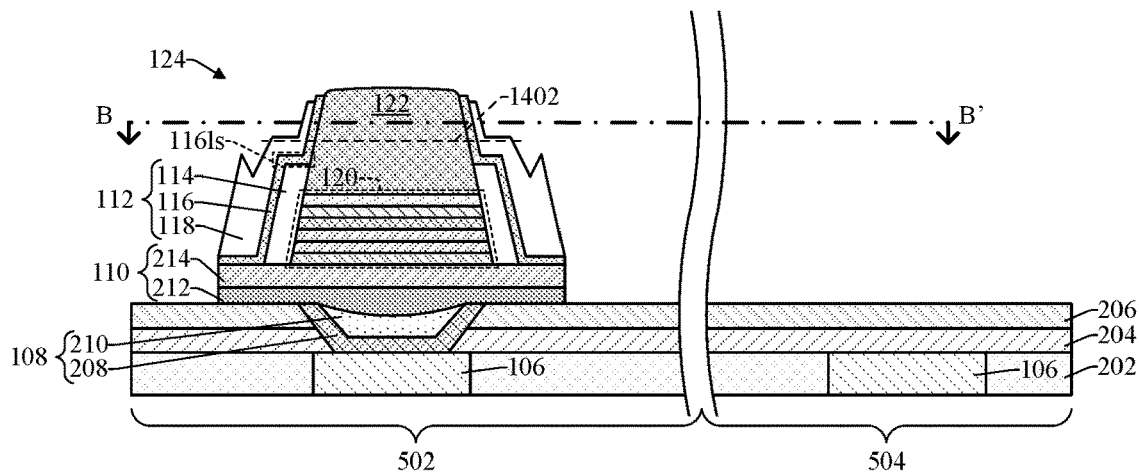
Figure 18B:
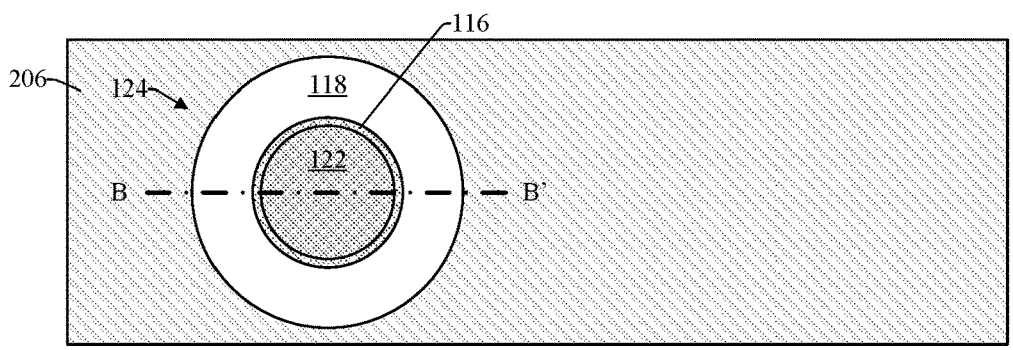

As shown in cross-sectional view 1800a of FIG. 18A and top view 1800b of FIG. 18B, a patterning process is performed on the structure of FIG. 17, thereby defining an MRAM cell 124, a sidewall spacer structure 112, and a bottom electrode 110. FIG. 18B illustrates a top view 1800b of alternative embodiments of the cross-sectional view 1800a of FIG. 18A shown along line B-B'.

The bottom electrode 110 includes the first and second bottom electrode layers 212, 214. The sidewall spacer structure 112 includes the first and second sidewall spacer layers 114, 118 and the protective sidewall spacer layer 116. The patterning process defines and exposes an upper surface of the top electrode 122 and may completely remove the top electrode capping layer (1106 of FIG. 17). In some embodiments, the upper surface of the top electrode 122 is rounded due to over etching during the patterning process. The patterning process removes a portion of the protective sidewall spacer layer 116 above the upper surface of the top electrode 122 and removes another portion of the protective sidewall spacer layer 116 contacting the second bottom electrode layer 214.

In some embodiments, the patterning process may include performing a dry etch process until an upper surface of the second dielectric layer 206 is reached. In some embodiments, the dry etch process may include using one or more etchants, such as chlorine-based etchants. For example, the chlorine-based etchants may, for example, be or comprise boron chloride (e.g, $BCl_3$), chloride gas ($Cl_2$), a combination of the forgoing, or the like. In some embodiments, the dry etch process may selectively-etch the top electrode 122, the top electrode capping layer (1106 of FIG. 17), the second sidewall spacer layer 118, the first bottom electrode layer 212, and/or the second bottom electrode layer 214 at first etching rate(s), and may selectively-etch the protective sidewall spacer layer 116 at a second etching rate, where the second etching rate is less than the first etching rate. For example, the first etching rate may be at least 5 times greater than the second etching rate. Thus, the etching process utilized to form the bottom electrode 110 and/or the MRAM cell 124 has a low selectivity for the protective sidewall spacer layer 116 relative to adjacent layers (e.g., the first and/or second sidewall spacer layers 114, 118, the top electrode 114, and/or the first and/or second bottom electrode layers 212, 214). This, in part, facilities formation of the MRAM cell 124 and the bottom electrode 110 while preventing damage to the protective sidewall spacer layer 116. Thus, the protective sidewalls spacer layer 116 may protect the MTJ 120 and/or the top electrode 122 during subsequent processing steps (e.g., FIG. 21A-B).

In some embodiments, during the pattering process of FIGS. 18A-B, the second sidewall spacer layer 118 may, for example, be etched at a rate of about 430 Angstroms per a minute (A/min) and the protective sidewall spacer layer 116 may be etched at a rate of about 80 A/min or less. Thus, in some embodiments, the etching rate of the protective sidewall spacer layer 116 is at least 5 times less than the etching rate of the second sidewall spacer layer 118 (and/or the first sidewall spacer layer 114). This, in part, is because the protective sidewall spacer layer 116 comprises a first material (e.g., aluminum oxide) and the first and/or second sidewall spacer layers each comprise a second material (e.g., silicon nitride) different than the first material. In some embodiments, if the first sidewall spacer layer 114 is not defined as described in FIG. 14, then the lateral segment 116ls of the protective sidewall spacer layer 116 may be damaged and/or removed during the patterning process of FIGS. 18A-B. This is because the patterning process performed on FIG. 17 may over etch and remove a portion of the top electrode 122 and/or the protective sidewall spacer layer 116 below the substantially straight line 1402. In such embodiments, the lateral segment 116ls of the protective sidewall spacer layer 116 may be removed. This may cause damage to the MTJ 120 during subsequent processing steps (e.g., at FIGS. 21A-21B). As shown in the top view 1800b of FIG. 18B, the protective sidewall spacer layer 116 continuously surrounds the top electrode 122.

Figure 19:
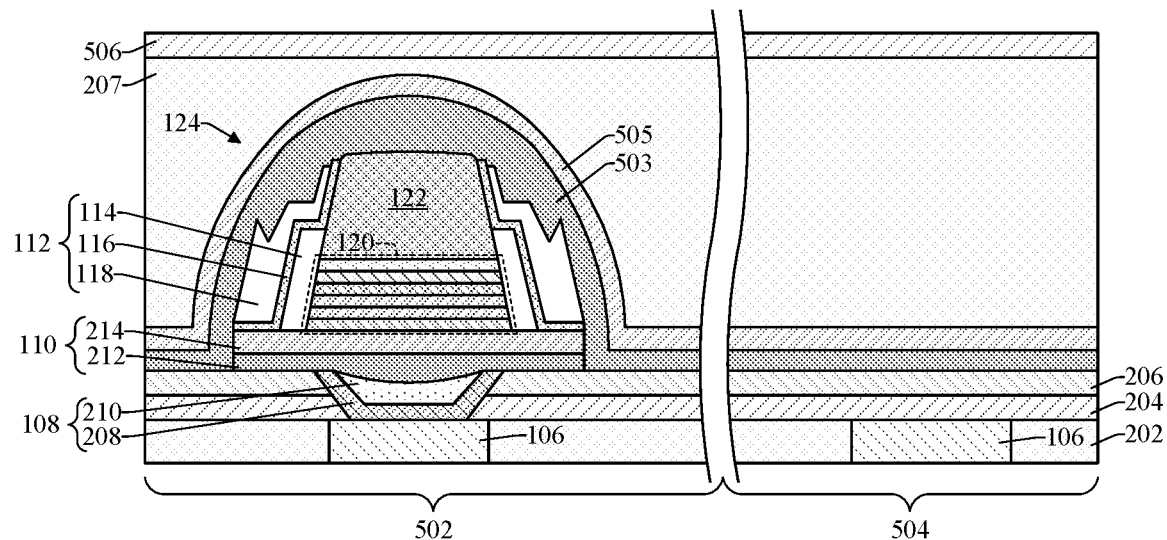

As shown in cross-sectional view 1900 of FIG. 19, a first outer sidewall spacer layer 503 and a second outer sidewall spacer layer 505 are formed over the MRAM cell 124. In some embodiments, the first outer sidewall spacer layer 503 may, for example, be or comprise silicon oxy-carbide and/or may be formed to a thickness of about 150 Angstroms. In some embodiments, the second outer sidewall spacer layer 505 may, for example, be or comprise silicon oxy-nitride and/or may be formed to a thickness of about 200 Angstroms. A second ILD layer 207 is formed over the first and second outer sidewall spacer layers 503, 505. The second ILD layer 207 may, for example, be or comprise an oxide, such as silicon dioxide, or another suitable dielectric material. A dielectric protection layer 506 is formed over the second ILD layer 207. In some embodiments, the dielectric protection layer 506 may, for example, be or comprise hydrogen and nitrogen doped carbide (HNDC), or another suitable dielectric material and/or may be formed to a thickness of about 300 Angstroms. In some embodiments, the first and/or second outer sidewall spacer layers 503, 505, the second ILD layer 207, and/or the dielectric protection layer 506 may, for example, each be deposited by CVD, PVD, ALD, or another suitable growth or deposition process.

Figure 20:
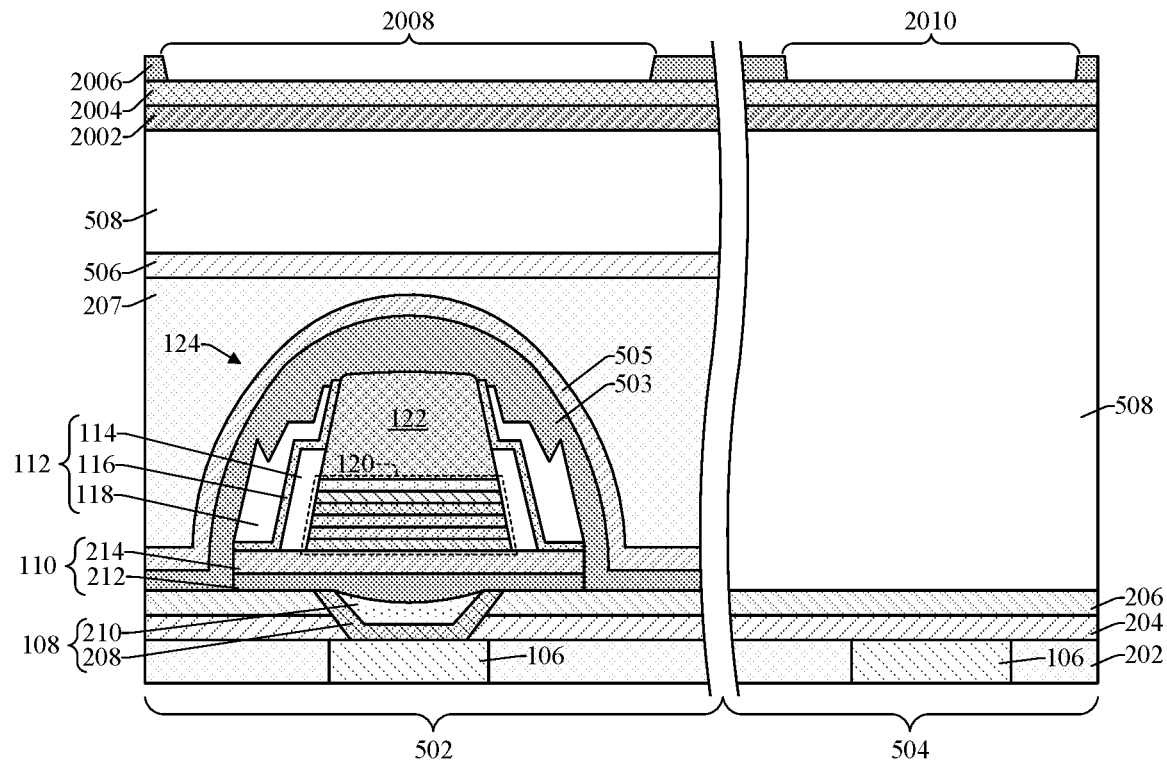

As shown in cross-sectional view 2000 of FIG. 20, the first and/or second outer sidewall spacer layers 503, 505, the second ILD layer 207, and/or the dielectric protection layer 506 are patterned in the logic region 504. Thus, the aforementioned layers and/or structures are removed from the logic region 504. The patterning process may include: 1) forming a masking layer (not shown) over the embedded memory region 502; 2) exposing the logic region 504 to one or more etchants; and 3) remove the masking layer. Further, a third ILD layer 508 is formed over the embedded memory region 502 and the logic region 504. A first upper dielectric layer 2002 is formed over the third ILD layer 508, a second upper dielectric layer 2004 is formed over the first upper dielectric layer 2002, and a masking layer 2006 is formed over the second upper dielectric layer 2004. The masking layer 2006 comprises sidewalls defining a first conductive feature opening 2008 overlying the MRAM cell 124 and sidewalls defining a second conductive feature opening 2010 overlying the lower interconnect wire 106 in the logic region 504. In some embodiments, the masking layer 2006 is patterned to form the first and second conductive feature openings 2008, 2010.

In some embodiments, the first upper dielectric layer 2002 may, for example, be or comprise an extreme low-k dielectric material, or another suitable dielectric material. The second upper dielectric layer 2004 may, for example, be or comprise a low-k dielectric material, a nitrogen free anti-reflection layer (NFARL), or the like. The masking layer 2006 may, for example, be or comprise titanium nitride, or another suitable material and/or may be formed to a thickness within a range of about 300 to 400 Angstroms.

Figure 21A:
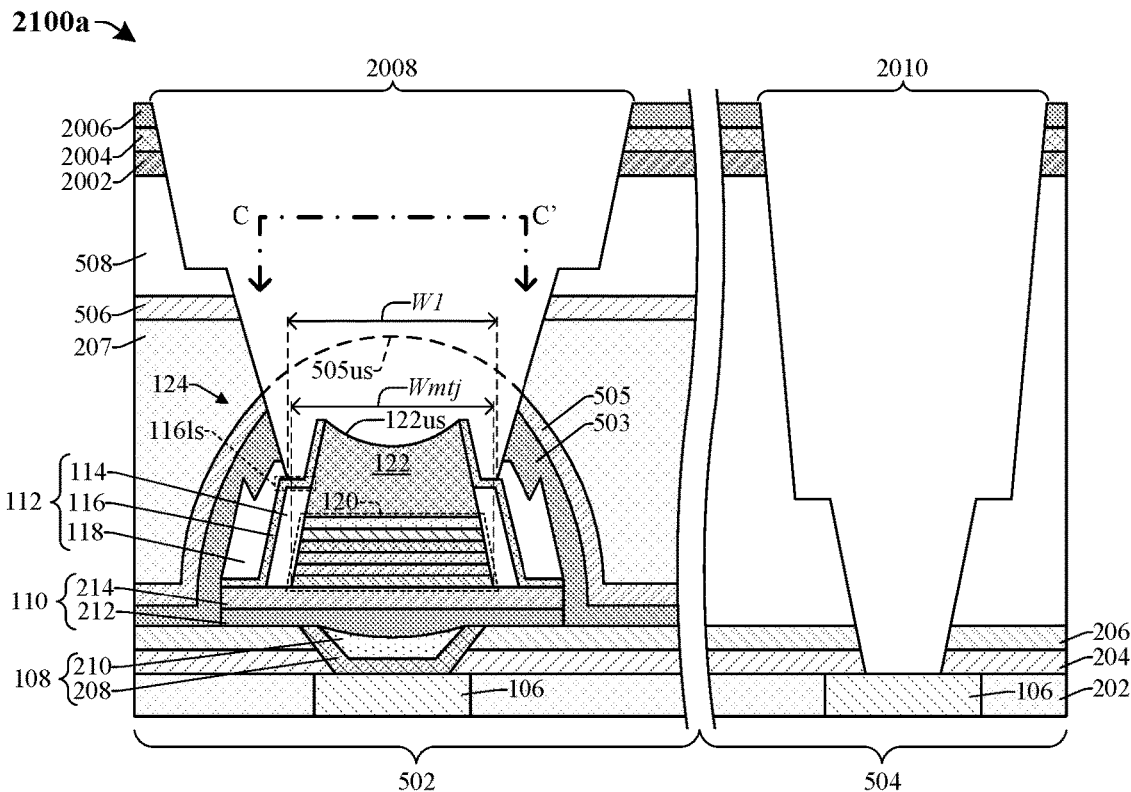
Figure 21B:
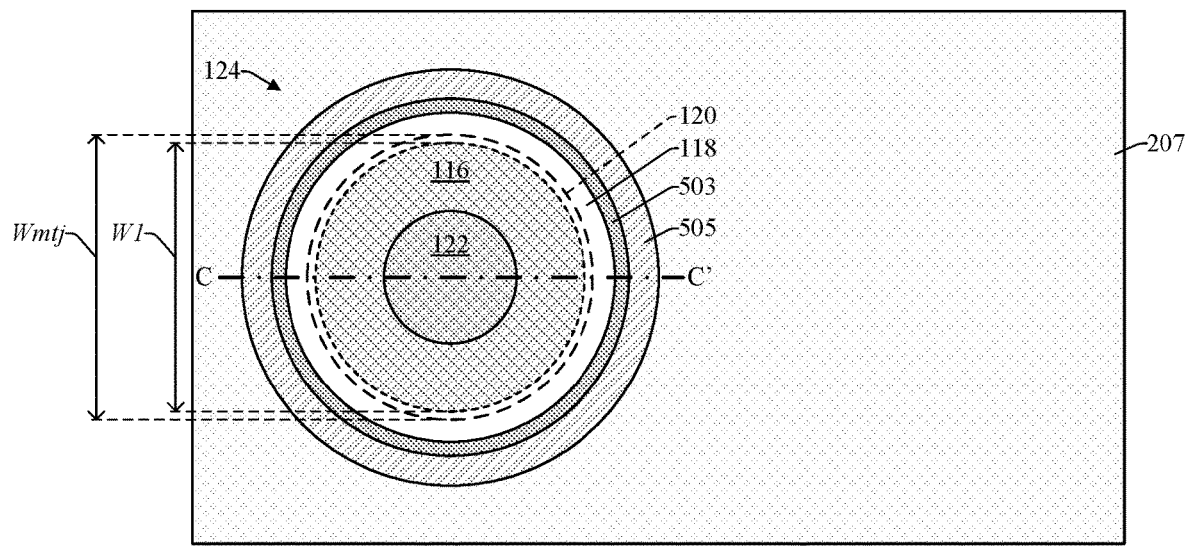

As shown in cross-sectional view 2100a of FIG. 21A and top view 2100b of FIG. 21B, a patterning process is performed on the structure of FIG. 20 according to the masking layer 2006, thereby expanding the first and second conductive feature openings 2008, 2010. FIG. 21B illustrates a top view 2100b of alternative embodiments of the cross-sectional view 2100a of FIG. 21A shown along line C-C'.

In some embodiments, the patterning process includes performing one or more etch processes and exposing unmasked regions of layers underlying the masking layer 2006 to one or more etchants. The one or more etch processes may include performing a first dry etch process into the first and second upper dielectric layers 2002, 2004, the third ILD layer 508, the dielectric protection layer 506, and the second ILD layer 207 until an upper surface 505us of the second outer sidewall spacer layer 505 is reached. In such embodiments, the second outer sidewall spacer layer 505 may not be etched by the first dry etch process. The one or more etch processes further includes performing a second dry etch process (e.g., a linear removal process (LMR)) to remove at least a portion of the first and second outer sidewall spacer layers 503, 505, and/or the second sidewall spacer layer 118. In some embodiments, the second dry etch process may utilizes one or more etchants, such as, for example, carbon fluoride (e.g., $C_4F_8$), argon (Ar), oxygen ($O_2$), a combination of the foregoing, or the like. In some embodiments, the second dry etch process may etch the first and second outer sidewall spacer layers 503, 505, and/or the second sidewall spacer layer 118 at a rate at least 5 times faster than the protection sidewall spacer layer 116 is etched. The one or more etch processes may further include performing a wet etch process. In some embodiments, the second etch process and/or the wet etch process may remove at least a portion of the top electrode 122, such that the top electrode 122 may have a curved and/or concave upper surface 122us. In some embodiments, the patterning process may include performing a dual damascene process.

In some embodiments, the one or more etch process persist longer than needed to ensure dielectric material is removed from the top electrode 122, thereby ensuring the subsequently formed top electrode via (126 of FIG. 22) makes a good and/or a stable electrical contact (e.g., an ohmic contact) with the top electrode 122. This, in part, results in a minimum width W1 of the first conductive feature opening 2008 to be greater than a width Wmtj of the MTJ 120. However, because the protective sidewall spacer layer 116 has a lower etching rate (as described above and/or in FIGS. 18A-B) than adjacent layers and/or structures (e.g., first and/or second outer sidewall spacer layers 503, 505, the second sidewall spacer layer 118, the second ILD layer 207, and/or the top electrode 122), the protective sidewall spacer layer 116 continuously surrounds and/or directly contacts outer sidewalls of the top electrode 122 after the patterning process. This, in part, ensures the protective sidewall spacer layer 116 persists during an over etching period and continues to protect sidewalls of the top electrode 122 and the MTJ 120, thereby preventing damage to the MTJ 120 during the patterning process and during subsequent processing steps (e.g., during formation of the top electrode via 126 in FIG. 22).

As illustrated in FIGS. 21A-B, the minimum width W1 of the first conductive feature opening 2008 is greater than the width Wmtj of the MTJ 120. In some embodiments, the width Wmtj of the MTJ 120 is a maximum width of the MTJ 120. Because the top electrode 122 was formed with the MTJ 120 (see FIG. 12), a maximum width of the top electrode 122 is less than the width Wmtj. Thus, the width W1 is greater than the maximum width of the top electrode 122.

Figure 22:
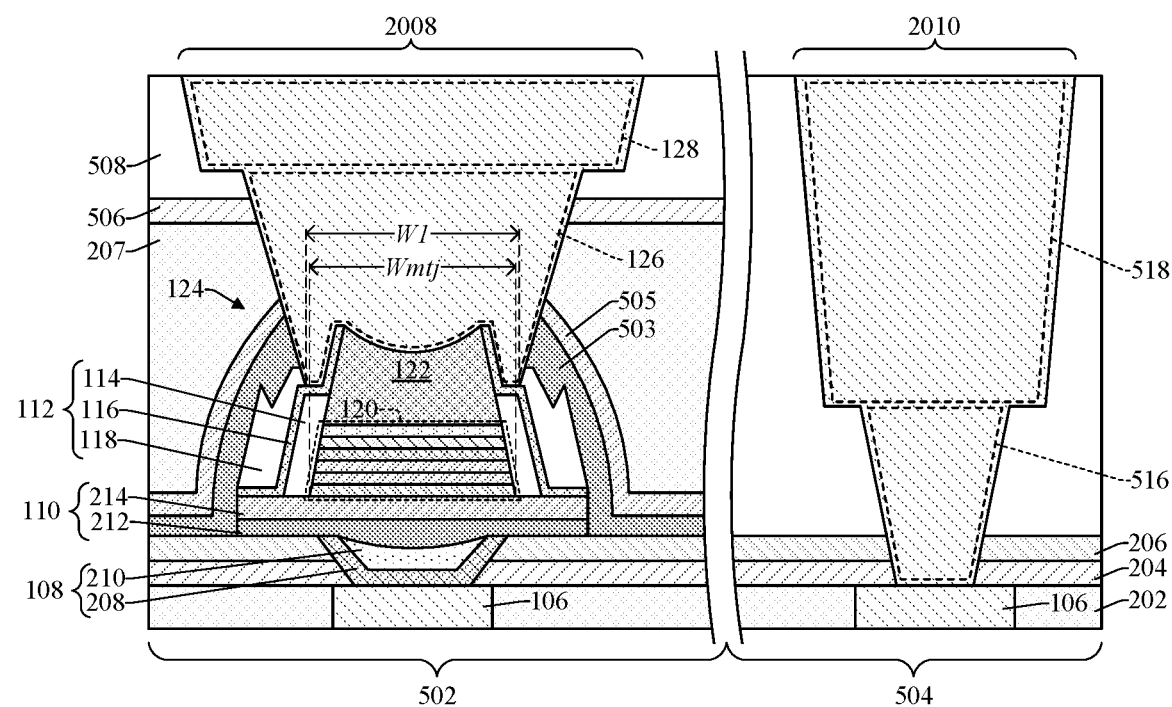

As shown in cross-sectional view 2200 of FIG. 22, a top electrode via 126 and an upper interconnect wire 128 are formed over the MRAM cell 124, and a conductive via 516 and a conductive wire 518 are formed over the lower interconnect wire 106 in the logic region 504. In some embodiments, a process for forming the top electrode via 126, the upper interconnect wire 128, and the conductive via and wire 516, 518 includes: 1) depositing (e.g., by CVD, PVD, electroless plating, sputtering, etc.) conductive material(s) (e.g. copper, aluminum, titanium nitride, tungsten, a combination of the foregoing, or the like) in the first and second conductive feature openings 2008, 2010; 2) performing a planarization process (e.g. CMP) into the conductive material(s) until an upper surface of the third ILD layer 508 is reached. In some embodiments, the planarization process removes the masking layer (2006 of FIG. 21A), and the first and second upper dielectric layers (2002, 2004 of FIG. 21A). In some embodiments, depositing the conductive material(s) may include forming a conductive liner (e.g., titanium nitride, tungsten, etc.) and subsequently forming a conductive body (e.g., aluminum, copper, aluminum copper, etc.) over the conductive liner.

Figure 23:
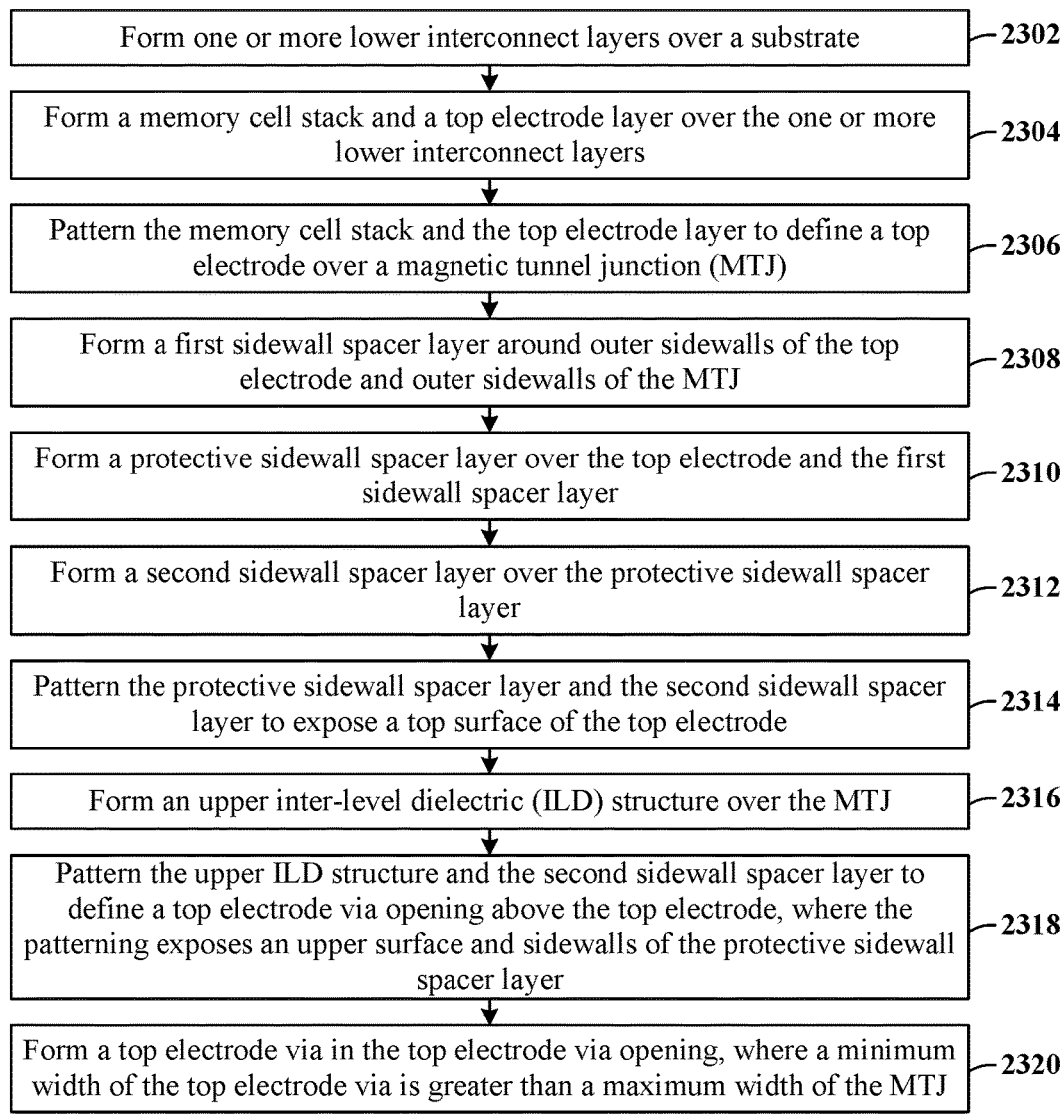
FIG. 23 illustrates a flowchart of some embodiments of a first method for forming an integrated chip having an MRAM cell comprising a top electrode via overlying a protective sidewall spacer layer.

FIG. 23 illustrates a flow diagram of some embodiments of a first method 2300 of forming an integrated chip having an MRAM cell comprising a top electrode via overlying a protective sidewall spacer layer.

While the first method 2300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2302, one or more interconnect layers are formed over a substrate. FIG. 11 illustrates a cross-sectional view 1100 of some embodiments corresponding to act 2302.

At act 2304, a memory cell stack and a top electrode layer are formed over the one or more lower interconnect layers. FIG. 11 illustrates a cross-sectional view 1100 of some embodiments corresponding to act 2304.

At act 2306, the memory cell stack and the top electrode layer are patterned to define a top electrode over a magnetic tunnel junction (MTJ). FIG. 12 illustrates a cross-sectional view 1200 of some embodiments corresponding to act 2306.

At act 2308, a first sidewall spacer layer is formed around outer sidewalls of the top electrode and outer sidewalls of the MTJ. FIGS. 13 and 14 illustrate cross-sectional views 1300 and 1400 of some embodiments corresponding to act 2308.

At act 2310, a protective sidewall spacer layer is formed over the top electrode and the first sidewall spacer layer. FIG. 15 illustrates a cross-sectional view 1500 of some embodiments corresponding to act 2310.

At act 2312, a second sidewall spacer layer is formed over the protective sidewall spacer layer. FIGS. 16 and 17 illustrate cross-sectional views 1600 and 1700 of some embodiments corresponding to act 2312.

At act 2314, the protective sidewall spacer layer and the second sidewall spacer layer are patterned to expose a top surface of the top electrode. FIG. 18A illustrates a cross-sectional view 1800a of some embodiments corresponding to act 2314.

At act 2316, an upper inter-level dielectric (ILD) structure is formed over the MTJ. FIGS. 19 and 20 illustrate cross-sectional views 1900 and 2000 of some embodiments corresponding to act 2316.

At act 2318, the upper ILD structure and the second sidewall spacer layer are patterned to define a top electrode via opening above the top electrode. The patterning exposes an upper surface and sidewalls of the protective sidewall spacer layer. FIG. 21A illustrates a cross-sectional view 2100a of some embodiments corresponding to act 2318.

At act 2320, a top electrode via is formed in the top electrode via opening. A minimum width of the top electrode via is greater than a maximum width of the MTJ. FIG. 22 illustrates a cross-sectional view 2200 of some embodiments corresponding to act 2320.

FIGS. 24-33 illustrate cross-sectional views 2400-3300 of some embodiments of a second method of forming an integrated chip having an MRAM cell comprising a protective sidewall spacer layer. Although the various views 2400-3300 shown in FIGS. 24-33 are described with reference to a method, it will be appreciated that the structures shown in FIGS. 24-33 are not limited to the second method but rather may stand alone separate of the method. Furthermore, although FIGS. 24-33 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 24:
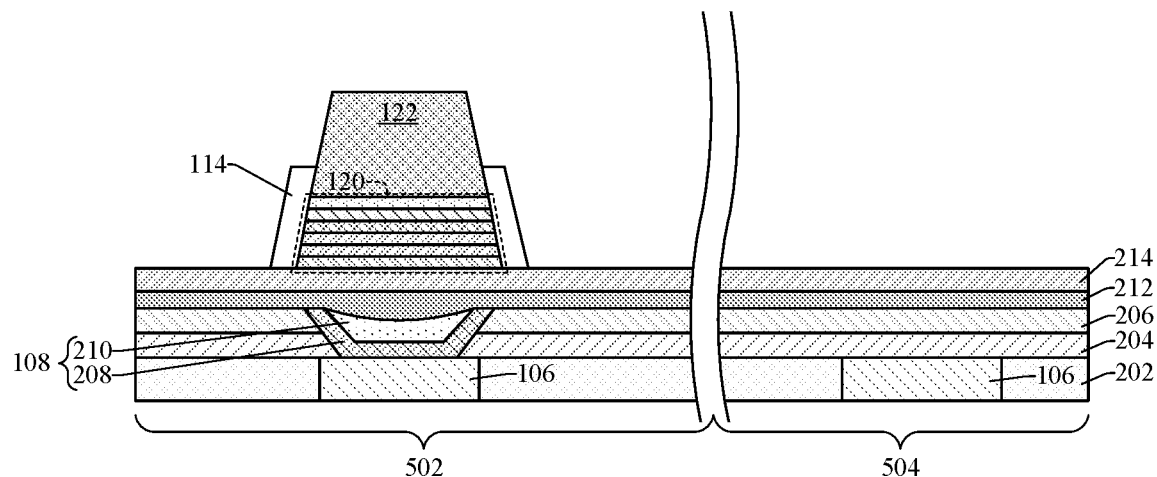
FIGS. 24-33 illustrate various views of some embodiments of a second method of forming an integrated chip having an MRAM cell comprising a protective sidewall spacer layer.

As shown in cross-sectional view 2400 of FIG. 24, a top electrode 122 is formed over an MTJ 120 and a first sidewall spacer layer 114 is formed around the top electrode 122 and the MTJ 120. In some embodiments, the top electrode 122, the MTJ 120, and the first sidewall spacer layer 114 may, for example, be formed by the processing steps illustrated and described in FIGS. 11-14. In such embodiments, the top electrode capping layer (1106 of FIG. 14) may be omitted and/or removed by a removal process (e.g., an etching process).

Figure 25:
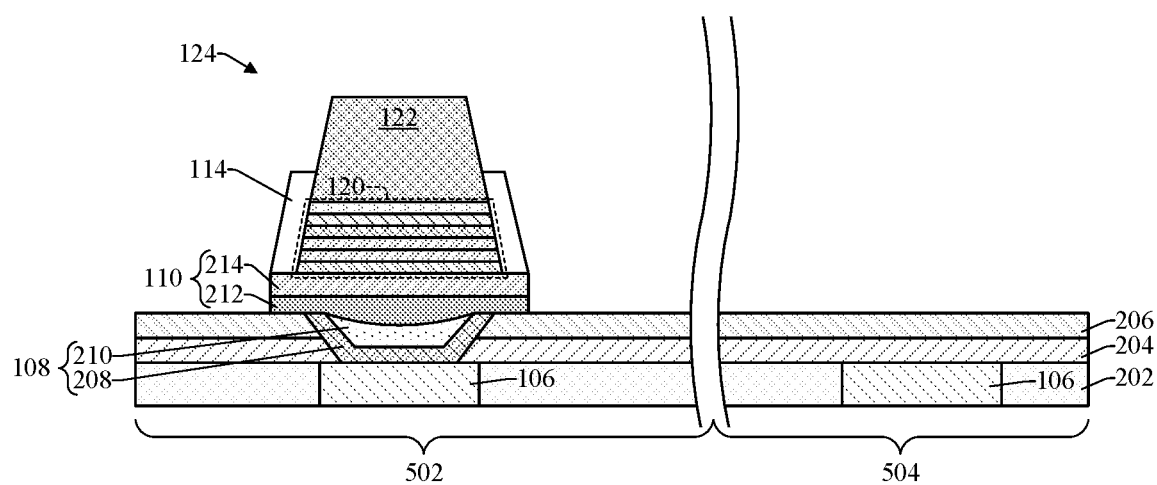

As shown in cross-sectional view 2500 of FIG. 25, the first bottom electrode layer 212 and the second bottom electrode layer 214 are patterned, thereby defining a bottom electrode 110 and defining an MRAM cell 124. In some embodiments, the patterning process may include: forming a masking layer (not shown) over the top electrode 122 and the MTJ 120; exposing unmasked regions of the first and second bottom electrode layers 212, 214 to one or more etchants, thereby defining the bottom electrode 110; and performing a removal process to remove the masking layer.

Figure 26:
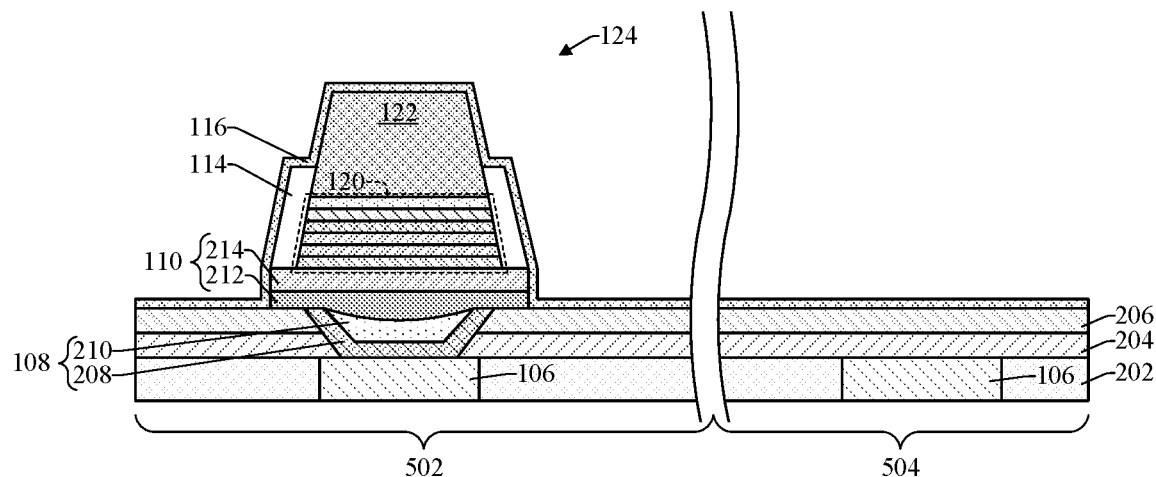

As shown in cross-sectional view 2600 of FIG. 26, a protective sidewall spacer layer 116 is formed over the top electrode 122, the MTJ 120, and the first sidewall spacer layer 114. In some embodiments, the protective sidewall spacer layer 116 may, for example, be or comprise a metal oxide, such as aluminum oxide (e.g., $AlO_x$, where x is a positive whole number), or the like and/or may be formed to a thickness within a range of about 30 to 100 Angstroms. In further embodiments, the protective sidewall spacer layer 116 may, for example, be or comprise a metal nitride, such as aluminum nitride, or the like and/or may be formed to a thickness within a range of about 30 to 100 Angstroms. Other thicknesses and/or materials is/are, however, amenable for the protective sidewall spacer layer 116. The protective sidewall spacer layer 116 may, for example, be deposited by CVD, PVD, ALD, or another suitable deposition process.

Figure 27:
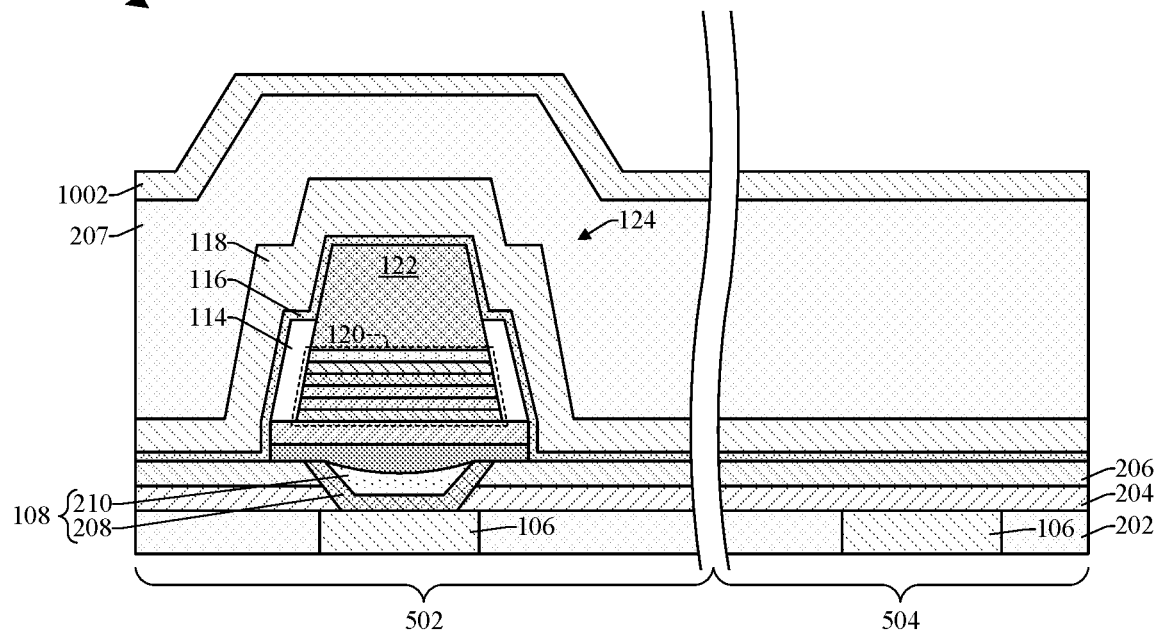

As shown in cross-sectional view 2700 of FIG. 27, a second sidewall spacer layer 118 is formed over the protective sidewall spacer layer 116. A second ILD layer 207 is formed over the second sidewall spacer layer 118 and a first dielectric protection layer 1002 is formed over the second ILD layer 207. In some embodiments, the second sidewall spacer layer 118, the second ILD layer 207, and/or the first dielectric protection layer 1002 are respectively, for example, deposited by CVD, PVD, ALD, or another suitable deposition process.

Figure 28:
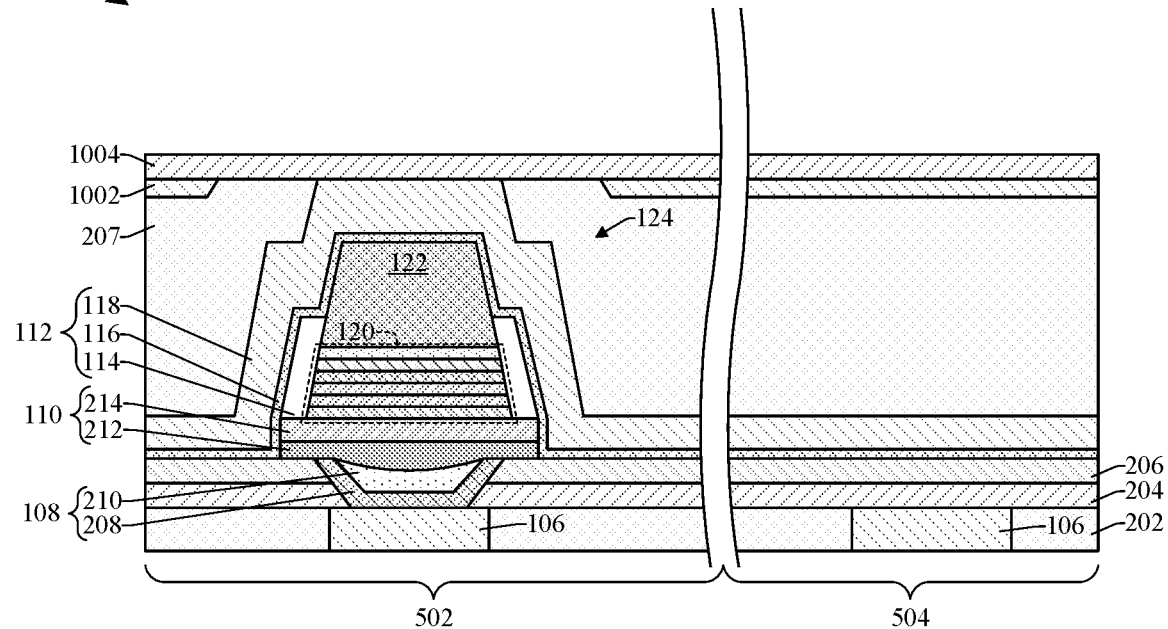

As shown in cross-sectional view 2800 of FIG. 28, a planarization process (e.g., a chemical mechanical planarization (CMP) process) is performed on the structure of FIG. 27. Further, after performing the planarization process, a second dielectric protection layer 1004 is formed over the first dielectric protection layer 1002 and the second ILD layer 207. In some embodiments, the second dielectric protection layer 1004 may, for example, be deposited by CVD, PVD, ALD or another suitable deposition process.

Figure 29:
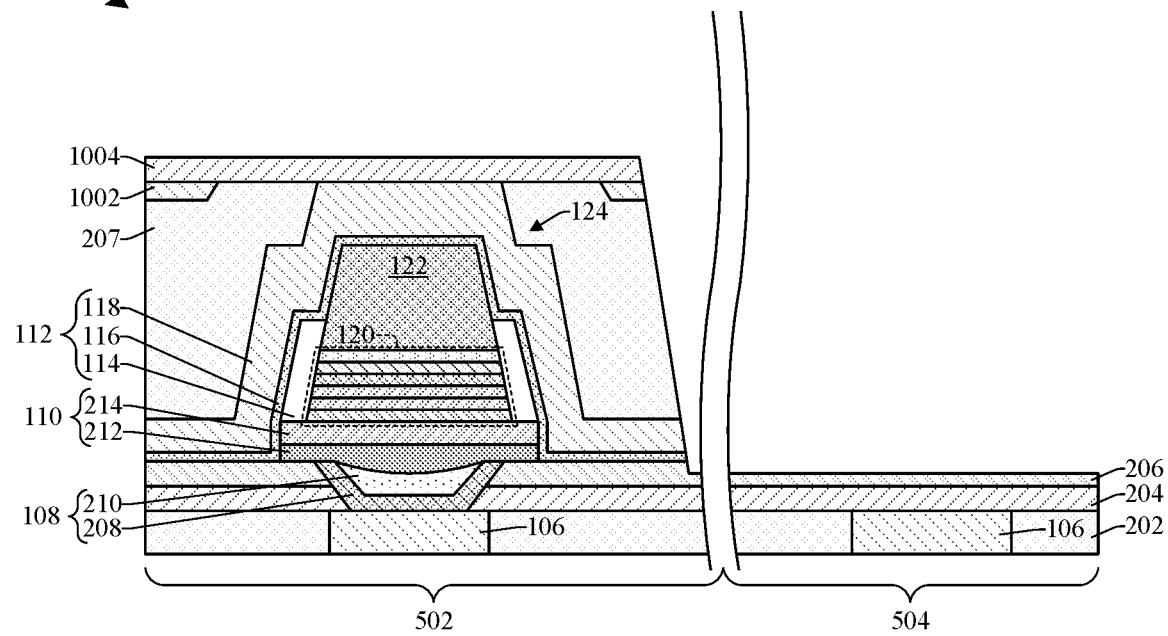

As shown in cross-sectional view 2900 of FIG. 29, a patterning process is performing on the structure of FIG. 28 to remove layers overlying the second dielectric layer 206 in the logic region 504. In such embodiments, the protective sidewall spacer layer 116 is completed remove from the logic region 504, such that the second dielectric layer 206 may be over-etched by the patterning process. Further, in some embodiments, the patterning process may include: forming a masking layer (not shown) over the MRAM cell 124; exposing unmasked regions of the logic region 504 to one or more etchants, thereby exposing an upper surface of the second dielectric layer 206 within the logic region 504; and performing a removal process to remove the masking layer.

Figure 30:
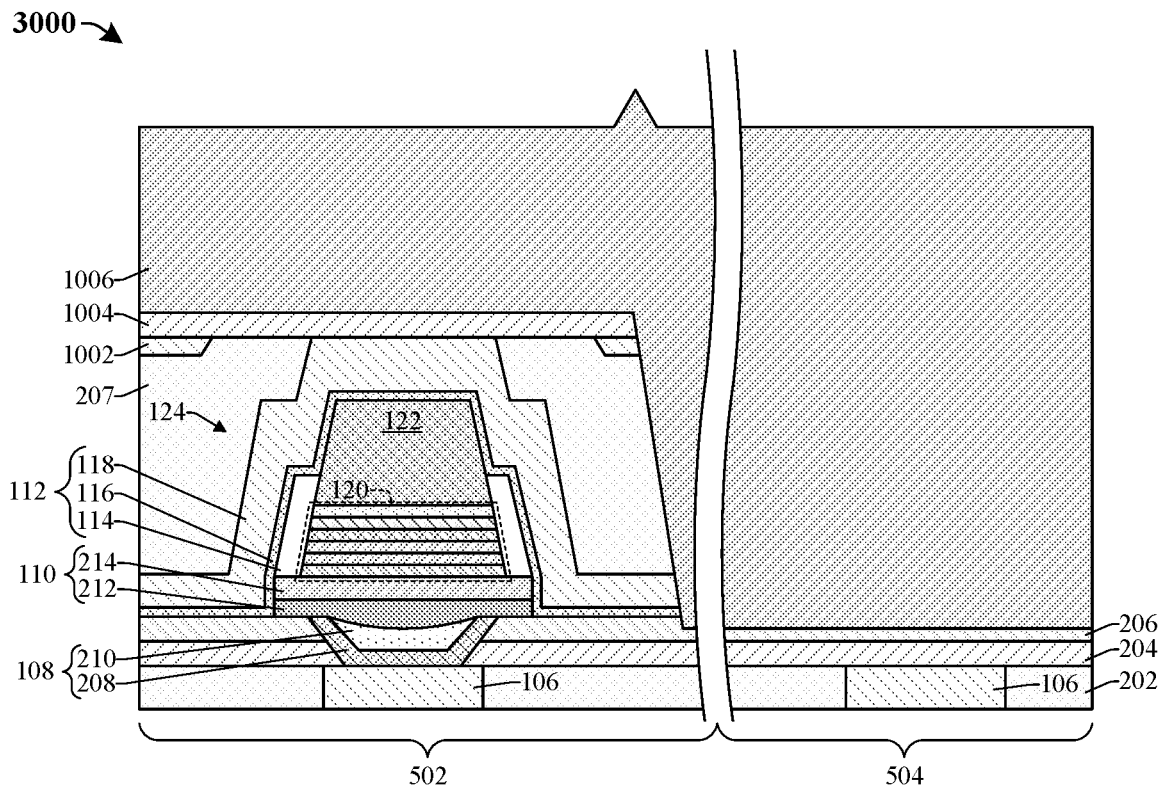

As shown in cross-sectional view 3000 of FIG. 30, an upper ILD layer 1006 is formed over the embedded memory region 502 and the logic region 504. In some embodiments, the upper ILD layer 1006 may, for example, be deposited by CVD, PVD, ALD, or another suitable deposition process. In some embodiments, the upper ILD layer 1006 may, for example, be or comprise a low-k dielectric material, silicon oxycarbide, another suitable dielectric material, or the like.

Figure 31:
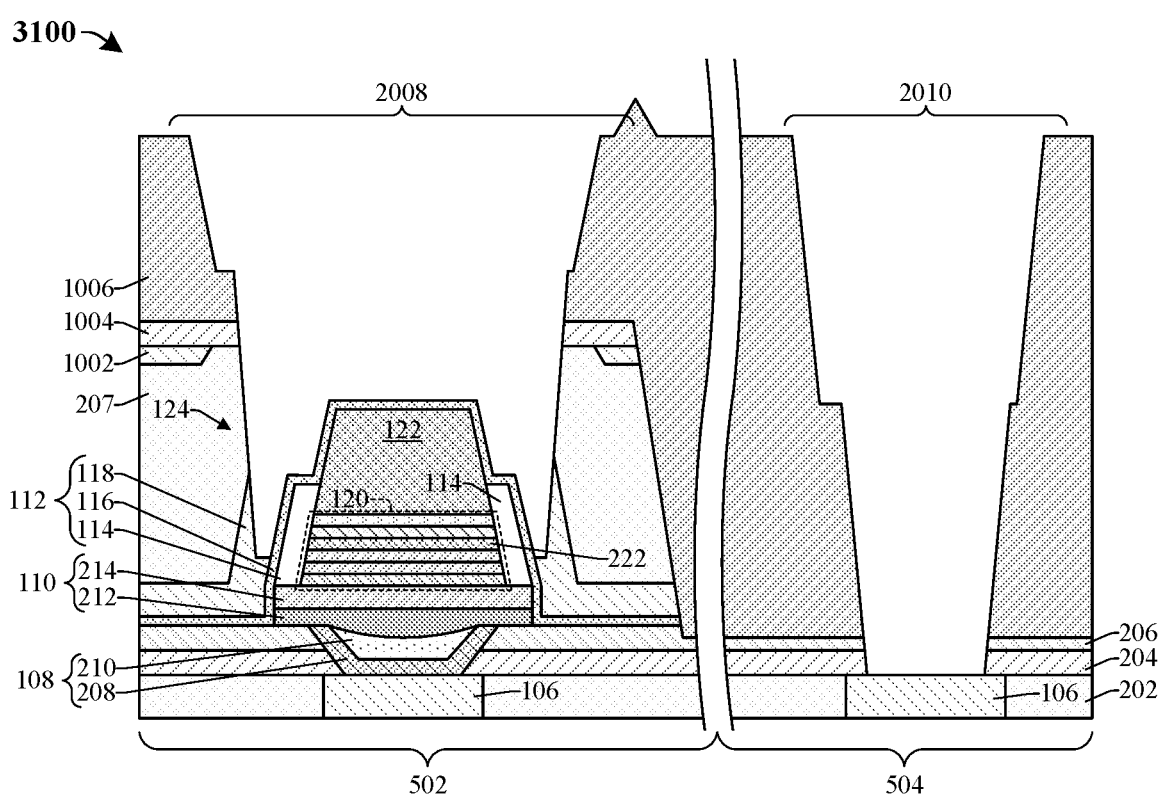

As shown in cross-sectional view 3100 of FIG. 31, the structure of FIG. 30 is patterned, thereby defining a first conductive feature opening 2008 in the embedded memory region 502 and a second conductive feature opening 2010 in the logic region 504. In some embodiments, the patterning process includes: forming a masking layer (not shown) over the upper ILD layer 1006; exposing unmasked regions of layers underlying the masking layer to one or more etchants, thereby defining the first and second conductive feature openings 2008, 2010; and removing the masking layer. In some embodiments, the masking layer (not shown) comprises sidewalls defining the first conductive feature opening 2008 overlying the MRAM cell 124 and sidewalls defining the second conductive feature opening 2010 overlying the lower interconnect wire 106 in the logic region 504.

In some embodiments, the patterning process of FIG. 31 may include performing one or more dry etch processes until an upper surface and/or a sidewall of the protective sidewall spacer layer 116 are exposed. In some embodiments, the one or more dry etch processes may selectively-etch the upper ILD layer 1006, the first and second dielectric protection layers 1002, 1004, the second sidewall spacer layer 118, and/or the second ILD layer 207 at first etching rate(s), and may selectively-etch the protective sidewall spacer layer 116 at a second etching rate, where the second etching rate is less than the first etching rate. For example, the first etching rate may be at least 5 times greater than the second etching rate. This in turn prevents and/or mitigates damage to the MRAM cell 124 during the patterning process.

Figure 32:
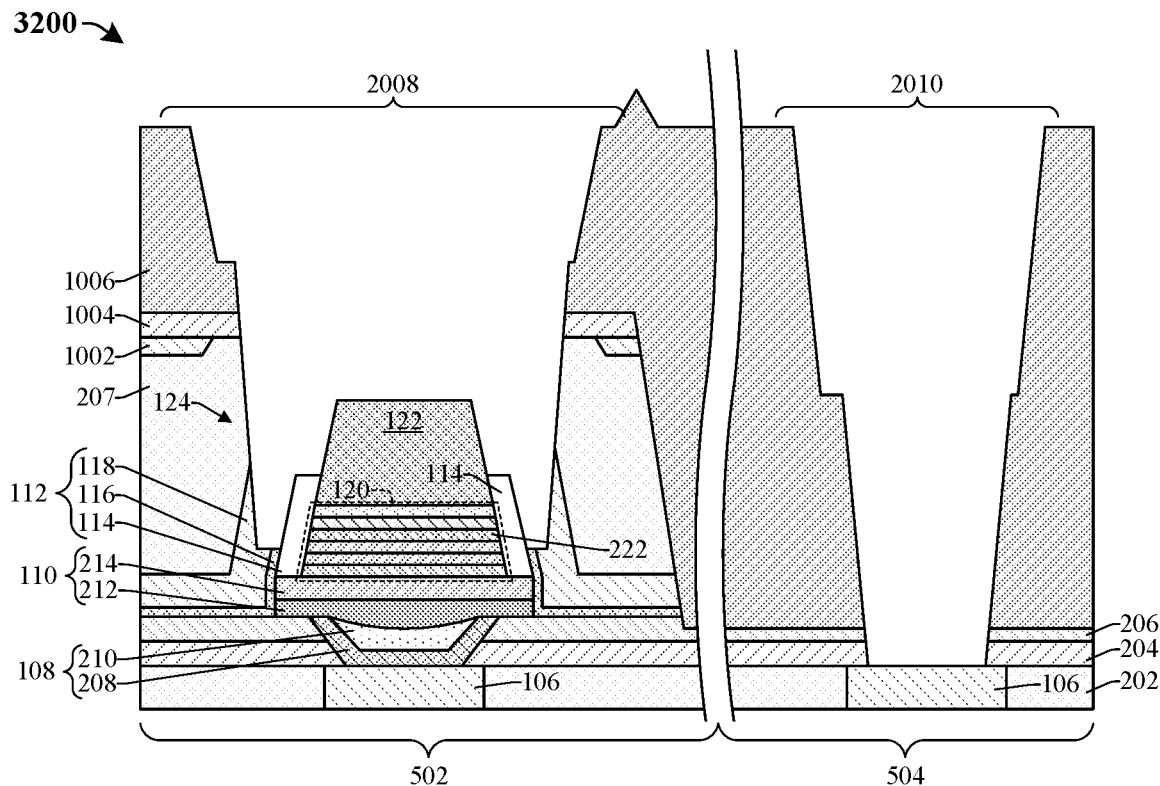

As shown in cross-sectional view 3200 of FIG. 32, the protective sidewall spacer layer 116 is patterned to expose the top electrode 122 and/or the first sidewall spacer layer 114. In some embodiments, the patterning process may include performing a wet etch process. In some embodiments, the wet etch may selectively-etch the upper ILD layer 1006, the first and second dielectric protection layers 1002, 1004, the second ILD layer 207, the second sidewall spacer layer 118, and/or the top electrode 122 at third etching rate(s), and may selectively-etch the protective sidewall spacer layer 116 at a fourth etching rate, where the fourth etching rate is greater than the third etching rate(s). In further embodiments, the patterning process may solely comprise a wet etch comprising one or more etchants. For example, in some embodiments, the fourth etching rate may, for example, be about 10, 20, 30, or 40 times greater than the third etching rate(s). Thus, in some embodiments, the upper surface and/or sidewall(s) of the top electrode 122 may be exposed without damaging adjacent dielectric structure(s)/layer(s) and/or without exposing layers disposed within the MTJ 120.

In some embodiments, during the patterning process of FIG. 32, the upper ILD layer 1006, the first and second dielectric protection layers 1002, 1004, the second ILD layer 207, the second sidewall spacer layer 118, and/or the top electrode 122 may, for example, each be etched at a rate of about 1 Angstrom per a minute (A/min) and the protective sidewall spacer layer 116 may be etched at a rate of about 40 A/min. Thus, an upper surface and/or sidewall(s) of the top electrode 122 may be exposed without damaging adjacent layers and/or structures.

Figure 33:
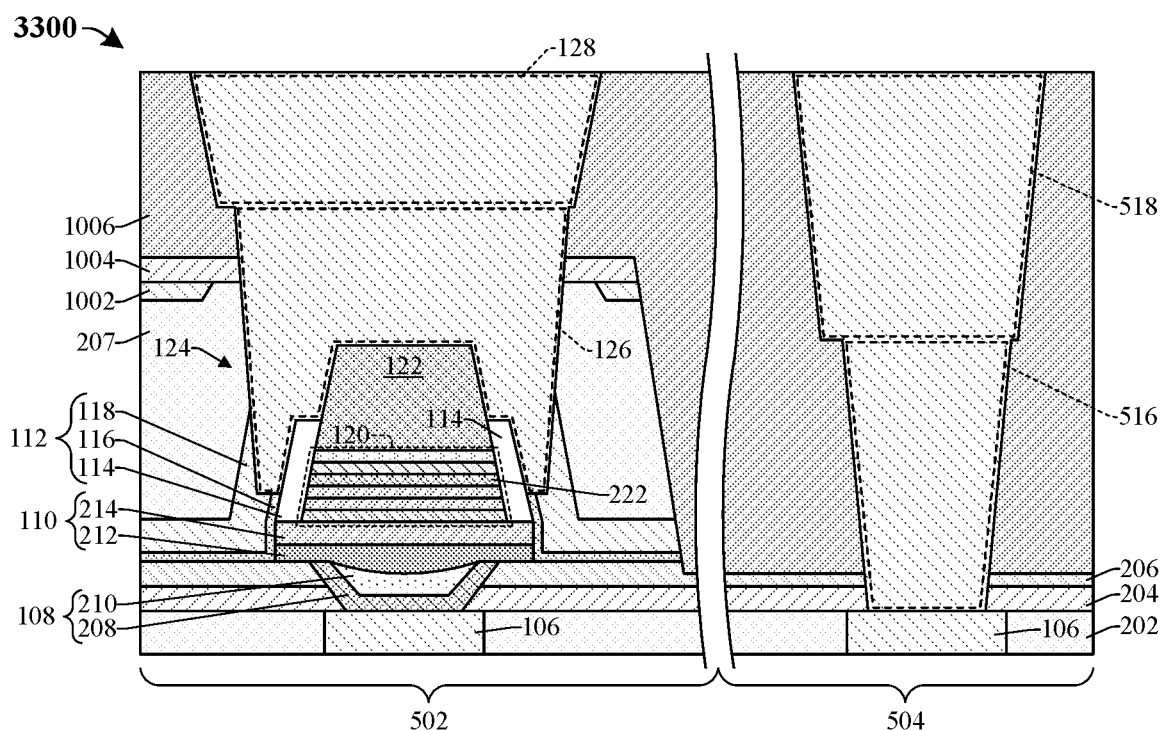

As shown in cross-sectional view 3300 of FIG. 33, a top electrode via 126 and an upper interconnect wire 128 are formed over the MRAM cell 124, and a conductive via 516 and a conductive wire 518 are formed over the lower interconnect wire 106 in the logic region 504. In some embodiments, a process for forming the top electrode via 126, the upper interconnect wire 128, and the conductive via and wire 516, 518 includes: depositing (e.g., by CVD, PVD, electroless plating, sputtering, etc.) conductive material(s) (e.g. copper, aluminum, titanium nitride, tungsten, a combination of the foregoing, or the like) in the first and second conductive feature openings (2008, 2010 of FIG. 32); and performing a planarization process (e.g. CMP) into the conductive material(s) and the upper ILD layer 1006. In some embodiments, depositing the conductive material(s) may include forming a conductive liner (e.g., titanium nitride, tungsten, etc.) and subsequently forming a conductive body (e.g., aluminum, copper, aluminum copper, etc.) over the conductive liner.

The second method illustrated in FIGS. 24-33 represents some embodiments of forming an MRAM cell 124 and a protective sidewall spacer layer 116 that laterally surrounds the MRAM cell 124. In some embodiments, by keeping the protective sidewall spacer layer 116 around and over the top electrode 122 and the MTJ 120 before forming the first and second conductive feature openings (2008, 2010 of FIG. 32) in the embedded memory region 502 and the logic region 504, damage to the top electrode 122 and/or the MTJ 120 may be eliminated or mitigated. For example, the protective sidewall spacer layer 116 prevents damage to the MTJ 120 and/or the top electrode 122 during the patterning process of FIG. 31, further the protective sidewall spacer layer 116 is removed by a wet etch process (e.g., FIG. 32) that mitigates damage to adjacent layers. This in turn may increase a performance of the MRAM cell 124. In some embodiments, if the protective sidewall spacer layer 116 does not continuously extend along an upper surface of the top electrode 122 before the patterning process of FIG. 31, the top electrode 122 may be damaged during the aforementioned patterning process. This may result in a poor electrical connect when forming a conductive structure in the first conductive feature opening 2008, thereby decreasing a performance of the MRAM cell 124.

Figure 34:
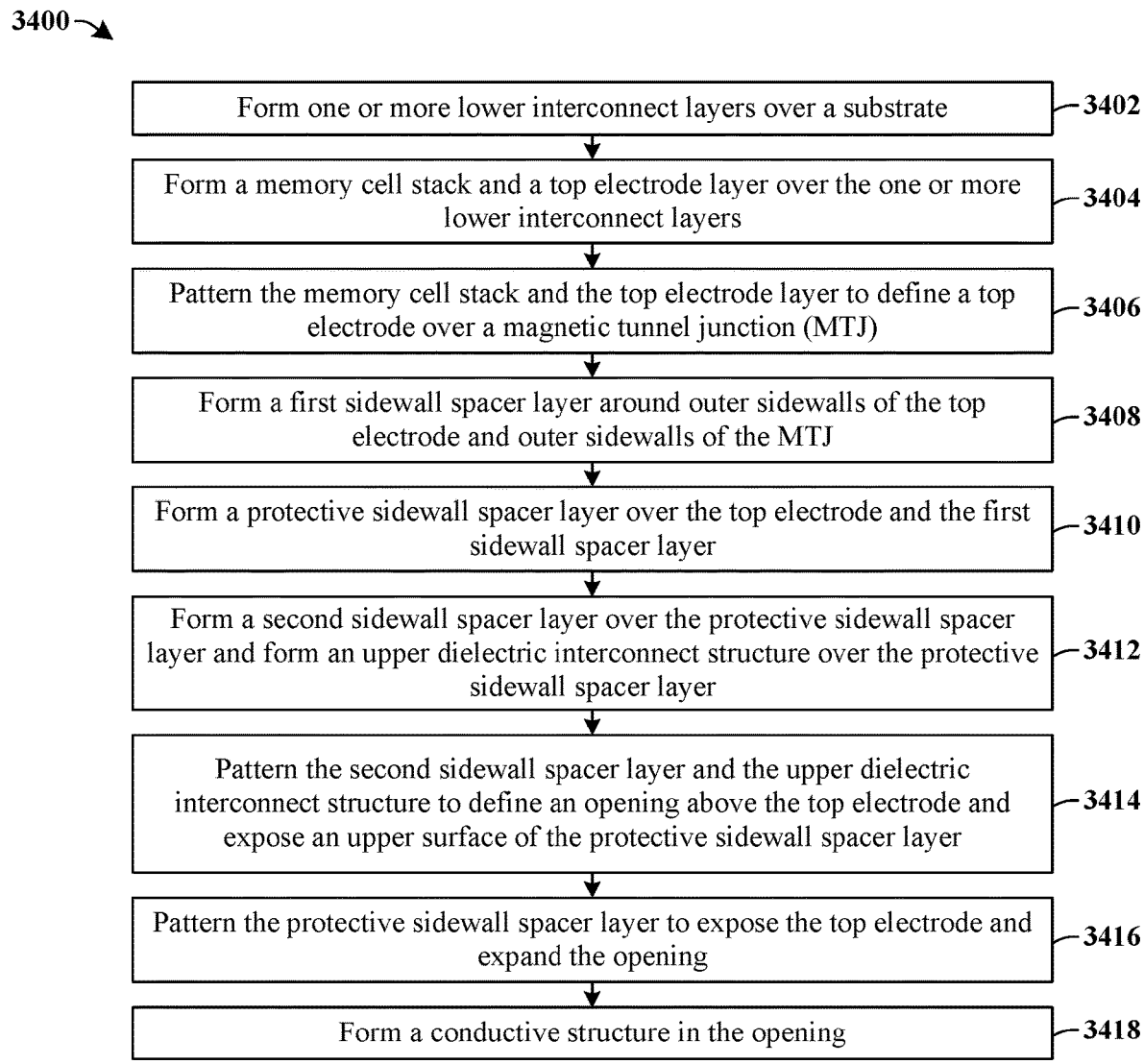
FIG. 34 illustrates a flowchart of some embodiments of a second method for forming an integrated chip having an MRAM cell comprising a protective sidewall spacer layer.

FIG. 34 illustrates a flow diagram of some embodiments of a second method 3400 of forming an integrated chip having an MRAM cell comprising a top electrode via overlying a protective sidewall spacer layer.

While the second method 3400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3402, one or more interconnect layers are formed over a substrate. FIG. 11 illustrates a cross-sectional view 1100 of some embodiments corresponding to act 3402.

At act 3404, a memory cell stack and a top electrode layer are formed over the one or more lower interconnect layers. FIG. 11 illustrates a cross-sectional view 1100 of some embodiments corresponding to act 3404.

At act 3406, the memory cell stack and the top electrode layer are patterned to define a top electrode over a magnetic tunnel junction (MTJ). FIG. 12 illustrates a cross-sectional view 1200 of some embodiments corresponding to act 3406.

At act 3408, a first sidewall spacer layer is formed around outer sidewalls of the top electrode and outer sidewalls of the MTJ. FIGS. 13 and 14 illustrate cross-sectional views 1300 and 1400 of some embodiments corresponding to act 3408.

At act 3410, a protective sidewall spacer layer is formed over the top electrode and the first sidewall spacer layer. FIG. 26 illustrates a cross-sectional view 2600 of some embodiments corresponding to act 3410.

At act 3412, a second sidewall spacer layer is formed over the protective sidewall spacer layer and an upper dielectric interconnect structure is formed over the protective sidewall spacer layer. FIGS. 27-30 illustrate cross-sectional views 2700-3000 of some embodiments corresponding to act 3412.

At act 3414, the second sidewall spacer layer and the upper dielectric interconnect structure are patterned to define an opening above the top electrode and expose an upper surface of the protective sidewall spacer layer. FIG. 31 illustrates a cross-sectional view 3100 of some embodiments corresponding to act 3414.

At act 3416, the protective sidewall spacer layer is patterned to expose the top electrode and expand the opening. FIG. 32 illustrates a cross-sectional view 3200 of some embodiments corresponding to act 3416.

At act 3418, a top electrode via is formed in the opening. FIG. 33 illustrates a cross-sectional view 3300 of some embodiments corresponding to act 3418.

Figure 35:
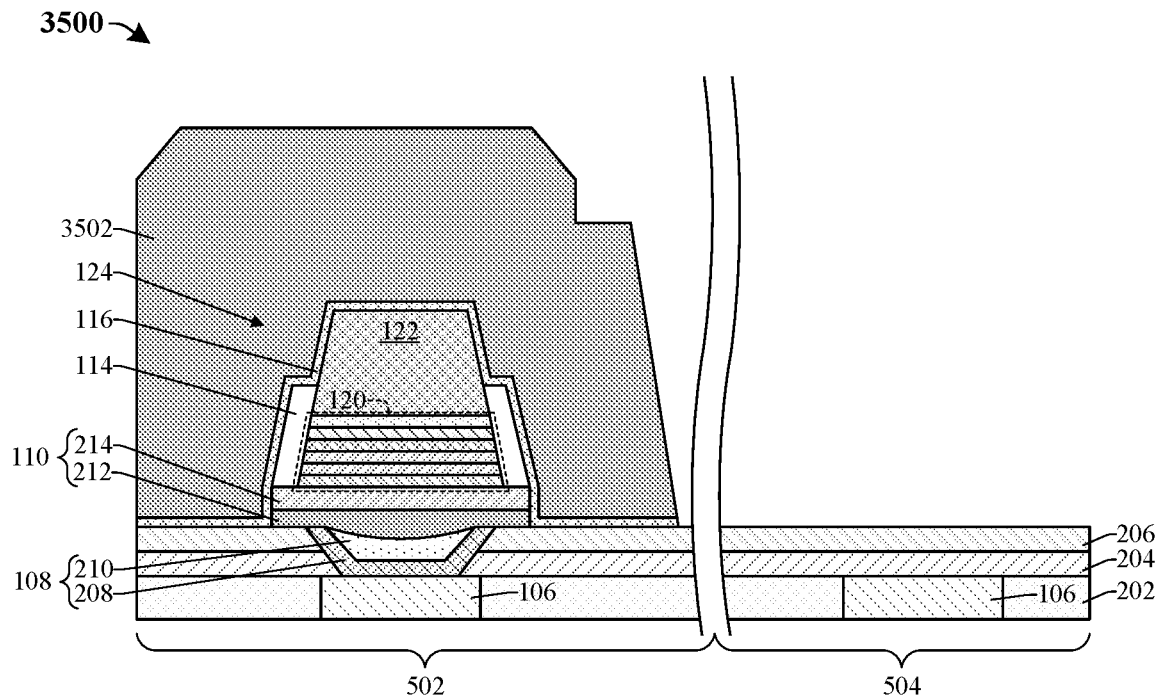
FIGS. 35 and 36 illustrate cross-sectional views of some alternative embodiments of the second method.
Figure 36:
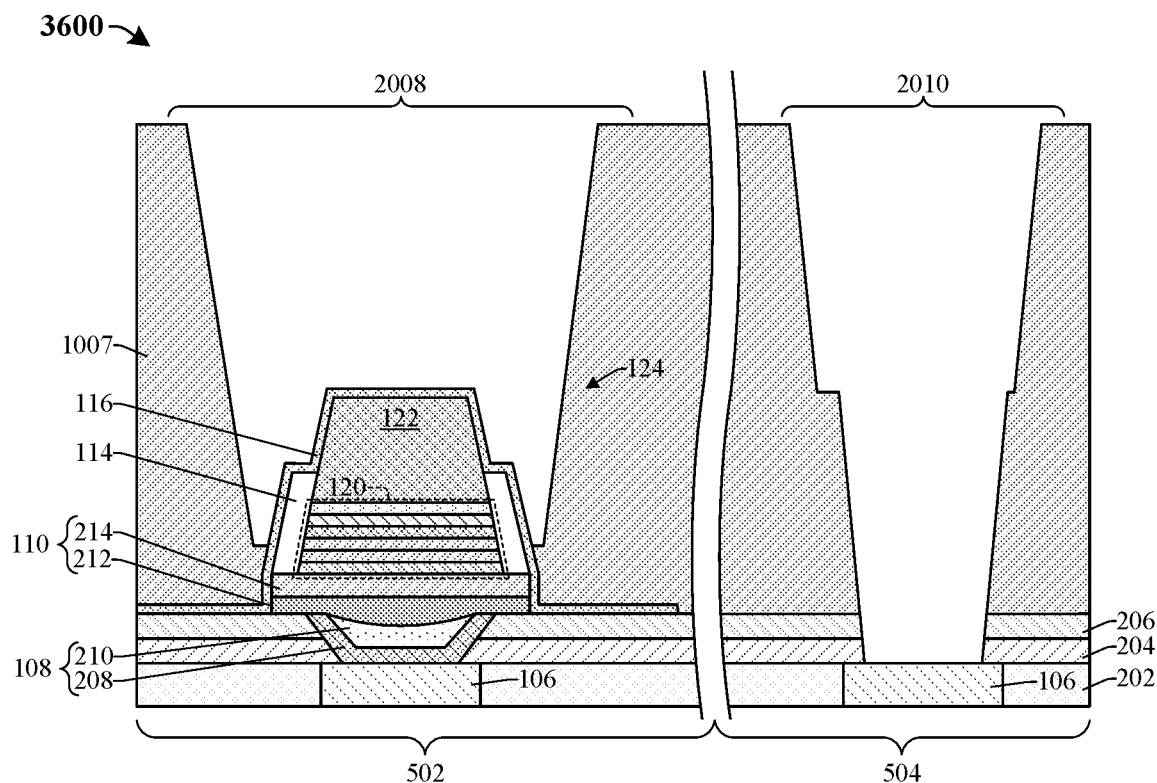

FIGS. 35-36 illustrate cross-sectional views 3500-3600 of some embodiments of acts that may be performed in place of the acts at FIGS. 27-31, such that the second method of FIGS. 24-33 may alternatively proceed from FIG. 26 to FIG. 35, FIG. 35 to FIG. 36, and then from FIG. 36 to FIGS. 32-33 (skipping FIGS. 27-31). As illustrated by the cross-sectional view 3500 of FIG. 35, a masking layer 3502 is formed over the protective sidewall spacer layer 116 disposed within the embedded memory region 502. Subsequently, the protective sidewall spacer layer 116 is patterned according to the masking layer 3502 to remove the protective sidewall spacer layer 116 from the logic region 504. As illustrated by the cross-sectional view 3600 of FIG. 36, an upper ILD structure 1007 is formed over the embedded memory region 502 and the logic region. In some embodiments, the upper ILD structure 1007 may, for example, be or comprise silicon oxycarbide, a low-k dielectric material, or another suitable dielectric material. In further embodiments, the upper ILD structure 1007 is patterned, thereby defining a first conductive feature opening 2008 in the embedded memory region 502 and a second conductive feature opening 2010 in the logic region 504.

In some embodiments, the patterning process of FIG. 36 may include performing one or more dry etch processes until an upper surface and/or sidewall(s) of the protective sidewall spacer layer 116 are exposed. In some embodiments, the one or more dry etch processes may selectively-etch the upper ILD structure 1007 at a first etching rate and may selectively-etch the protective sidewall spacer layer 116 at a second etching rate, where the second etching rate is less than the first etching rate. For example, the first etching rate may be at least 5 times greater than the second etching rate. This in turn prevents and/or mitigate damage to the MRAM cell 124 during the patterning process. In further embodiments, a conductive wire may be formed within the first conductive feature opening 2008 (after performing the act at FIG. 32), such that the conductive wire directly contacts the top electrode 122 (e.g., see FIG. 10B).

Figure 37:
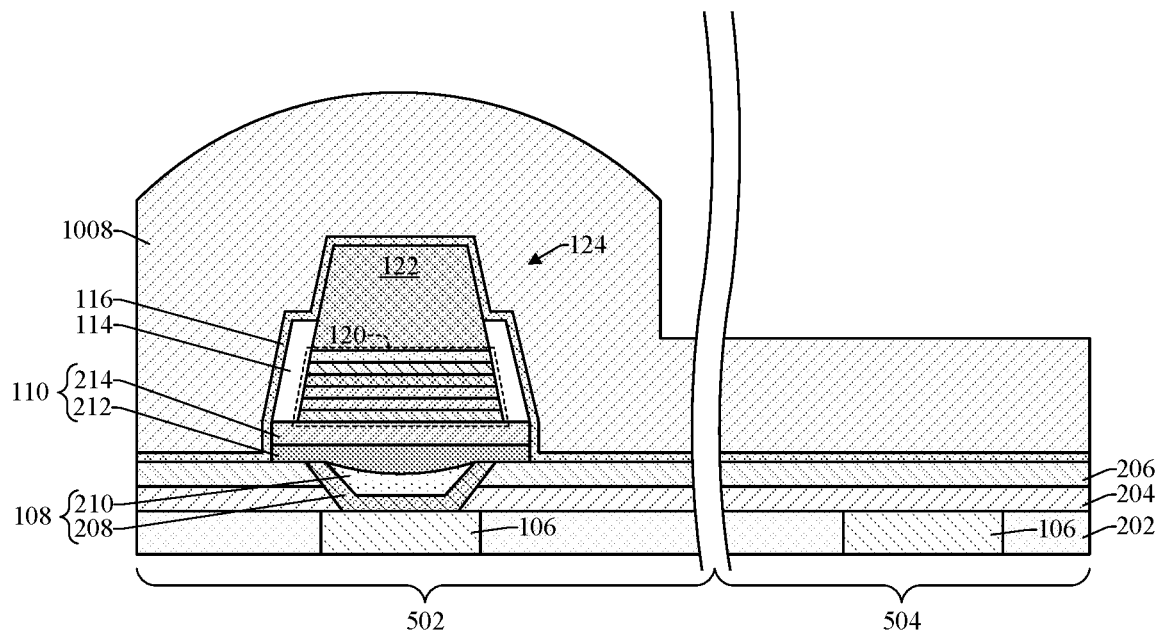
FIGS. 37-39 illustrate cross-sectional views of some additional alternative embodiments of the second method.
Figure 38:
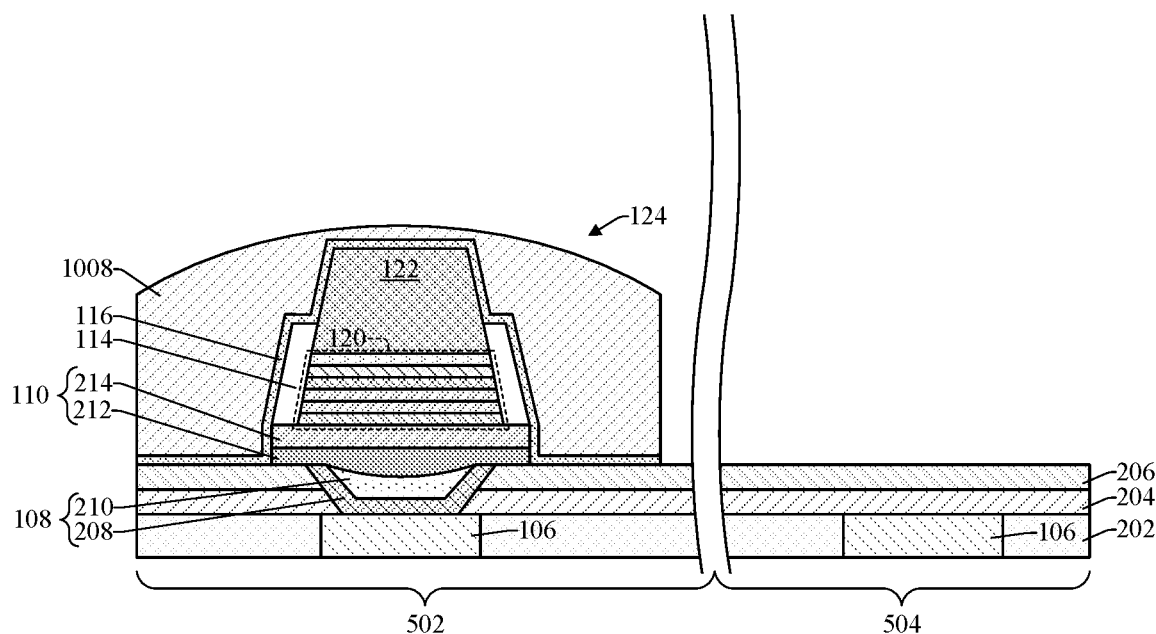
Figure 39:
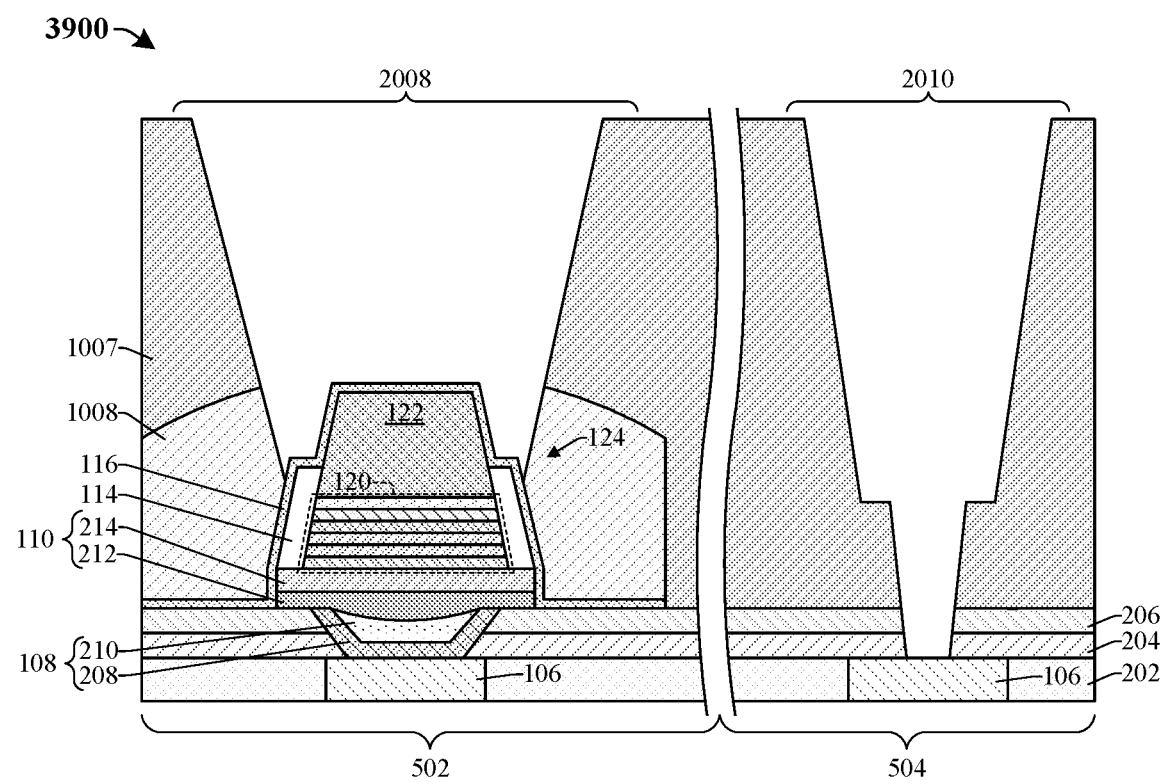

FIGS. 37-39 illustrate cross-sectional views 3700-3900 of some alternative embodiments of acts that may be performed in place of the acts at FIGS. 27-31, such that the second method of FIGS. 24-33 may alternatively proceed from FIG. 26 to FIG. 37, FIG. 37 to FIGS. 38-39, and then from FIG. 39 to FIGS. 32-33 (skipping FIGS. 27-31). As illustrated by cross-sectional view 3700 of FIG. 37, a dielectric fill layer 1008 is formed over the MRAM cell 124. In some embodiments, the dielectric fill layer 1008 may, for example, be or comprise tetra-ethyl-ortho-silicate (TEOS), (e.g., plasma enhanced TEOS, low particle TEOS, etc.), an oxide (e.g., silicon oxide, silicon dioxide, etc.), a nitride, or the like. As illustrated by cross-sectional view 3800 of FIG. 38, the dielectric fill layer 1008 and the protective sidewall spacer layer 116 are patterned, such that the dielectric fill layer 1008 and the protective sidewall spacer layer 116 are removed from the logic region 504. In some embodiments, the patterning process of FIG. 38 may include an etch-back process. As illustrated by cross-sectional view 3900 of FIG. 39, an upper ILD structure 1007 is formed over the embedded memory region 502 and the logic region. In some embodiments, the upper ILD structure 1007 may, for example, be or comprise silicon oxycarbide, a low-k dielectric material, or another suitable dielectric material. In further embodiments, the upper ILD structure 1007 is patterned, thereby defining a first conductive feature opening 2008 in the embedded memory region 502 and a second conductive feature opening 2010 in the logic region 504. In yet further embodiments, a conductive wire may be formed within the first conductive feature opening 2008 (after performing the act at FIG. 32), such that the conductive wire directly contacts the top electrode 122 (e.g., see FIG. 10C).

In some embodiments, the patterning process of FIG. 39 may include performing one or more dry etch processes until an upper surface and/or sidewall(s) of the protective sidewall spacer layer 116 are exposed. In some embodiments, the one or more dry etch processes may selectively-etch the upper ILD structure 1007 at a first etching rate and may selectively-etch the protective sidewall spacer layer 116 at a second etching rate, where the second etching rate is less than the first etching rate. For example, the first etching rate may be at least 5 times greater than the second etching rate. This in turn prevents and/or mitigate damage to the MRAM cell 124 during the patterning process.

Accordingly, in some embodiments, the present disclosure relates to a protective sidewall spacer layer continuously surrounding outer sidewalls of a top electrode and outer sidewalls of an MTJ. A top electrode via directly contacts the top electrode and the protective sidewall spacer layer.

In some embodiments, the present application provides an integrated chip, including a dielectric structure overlying a substrate; a magnetoresistive random access memory (MRAM) cell disposed within the dielectric structure, wherein the MRAM cell includes a magnetic tunnel junction (MTJ) sandwiched between a bottom electrode and a top electrode; a conductive wire overlying the top electrode and disposed within the dielectric structure; and a sidewall spacer structure continuously extending along a sidewall of the MTJ and the top electrode, wherein the sidewall spacer structure includes a first sidewall spacer layer, a second sidewall spacer layer, and a protective sidewall spacer layer sandwiched between the first and second sidewall spacer layers, wherein the first and second sidewall spacer layers comprise a first material and the protective sidewall spacer layer comprises a second material different than the first material.

In some embodiments, the present application provides an integrated chip including a substrate; a bottom electrode overlying the substrate; a magnetic tunnel junction (MTJ) overlying the bottom electrode; a top electrode overlying the MTJ; a top electrode via overlying the top electrode, wherein a minimum width of the top electrode via is greater than a maximum width of the MTJ; a first sidewall spacer layer disposed along an outer sidewall of the MTJ and an outer sidewall of the top electrode, wherein the first sidewall spacer layer includes a first material; a second sidewall spacer layer disposed along the outer sidewall of the top electrode, wherein the second sidewall spacer layer includes the first material; and a protective sidewall spacer layer disposed between the first and second sidewall spacer layers, wherein the protective sidewall spacer layer includes a second material different than the first material, wherein an upper surface of the protective sidewall spacer layer is vertically above a top surface of the MTJ, wherein the protective sidewall spacer layer is separated from the outer sidewall of the MTJ by the first sidewall spacer layer and the protective sidewall spacer layer directly contacts the outer sidewall of the top electrode.

In some embodiments, the present application provides a method of forming an integrated chip, the method including forming a memory cell stack over a substrate, wherein the memory cell stack includes a top electrode overlying a magnetic tunnel junction (MTJ); forming a sidewall spacer structure around the memory cell stack, wherein the sidewall spacer structure includes a first sidewall spacer layer, a second sidewall spacer layer, and a protective sidewall spacer layer sandwiched between the first and second sidewall spacer layers; forming an upper inter-level dielectric (ILD) structure over the sidewall spacer structure; performing a first etch process on the ILD structure and the second sidewall spacer layer to define an opening above the top electrode, wherein the first etch process exposes an upper surface and sidewalls of the protective sidewall spacer layer, and wherein the second sidewall spacer layer and the ILD structure are etched at a higher rate than the protective sidewall spacer layer during the first etch process; and filling the opening with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a dielectric structure overlying a substrate;
a magnetoresistive random access memory (MRAM) cell disposed within the dielectric structure, wherein the MRAM cell comprises a magnetic tunnel junction (MTJ) sandwiched between a bottom electrode and a top electrode;
a conductive wire overlying the top electrode and disposed within the dielectric structure;
a top electrode via disposed between the conductive wire and the top electrode, wherein a lower surface of the top electrode via comprises one or more segments disposed below an upper surface of the top electrode; and
a sidewall spacer structure continuously extending along a sidewall of the MTJ and the top electrode, wherein the sidewall spacer structure comprises a first sidewall spacer layer, a second sidewall spacer layer, and a protective sidewall spacer layer sandwiched between the first and second sidewall spacer layers, wherein the first and second sidewall spacer layers comprise a first material and the protective sidewall spacer layer comprises a second material different than the first material.

2. The integrated chip of claim 1, wherein the top electrode via contacts an upper surface of the protective sidewall spacer layer.

3. The integrated chip of claim 2, wherein the protective sidewall spacer layer comprises curved opposing sidewalls, wherein the lower surface of the top electrode via conforms to and directly contacts the curved opposing sidewalls of the protective sidewall spacer layer.

4. The integrated chip of claim 2, wherein the MTJ comprises a tunnel barrier layer disposed between a free layer and a pinned layer, wherein the first sidewall spacer layer continuously extends along opposing sidewalls of the tunnel barrier layer, opposing sidewalls of the free layer, and opposing sidewalls of the pinned layer to an inner surface of the protective sidewall spacer layer.

5. The integrated chip of claim 2, wherein the top electrode via comprises a semi-circular shaped protrusion laterally adjacent to a triangular shaped protrusion, wherein the upper surface of the top electrode directly contacts the semi-circular shaped protrusion and the protective sidewall spacer layer directly contacts the triangular shaped protrusion.

6. The integrated chip of claim 2, wherein the protective sidewall spacer layer continuously extends from the one or more segments of the top electrode via to a top surface of the bottom electrode.

7. The integrated chip of claim 2, wherein a width of the lower surface of the top electrode via is greater than a width of the upper surface of the top electrode.

8. The integrated chip of claim 7, wherein the width of the lower surface of the top electrode via is greater than a maximum width of the MTJ.

9. An integrated chip comprising:
a substrate;
a bottom electrode overlying the substrate;
a magnetic tunnel junction (MTJ) overlying the bottom electrode;
a top electrode overlying the MTJ;
a top electrode via overlying the top electrode, wherein a minimum width of the top electrode via is greater than a maximum width of the MTJ;
a first sidewall spacer layer disposed along an outer sidewall of the MTJ and an outer sidewall of the top electrode, wherein the first sidewall spacer layer comprises a first material;
a second sidewall spacer layer disposed along the outer sidewall of the top electrode, wherein the second sidewall spacer layer comprises the first material; and
a protective sidewall spacer layer disposed between the first and second sidewall spacer layers, wherein the protective sidewall spacer layer comprises a second material different than the first material, wherein an upper surface of the protective sidewall spacer layer is vertically above a top surface of the MTJ, wherein the protective sidewall spacer layer is separated from the outer sidewall of the MTJ by the first sidewall spacer layer and the protective sidewall spacer layer directly contacts the outer sidewall of the top electrode.

10. The integrated chip of claim 9, wherein the first material is silicon nitride or silicon carbide and the second material is aluminum oxide or aluminum nitride.

11. The integrated chip of claim 9, wherein the top electrode and the MTJ are laterally spaced between opposing sidewalls of the top electrode via, respectively.

12. The integrated chip of claim 9, wherein the upper surface of the protective sidewall spacer layer is disposed between opposing sidewalls of the protective sidewall spacer layer, wherein the top electrode via continuously extends from a first sidewall of the opposing sidewalls to a second sidewall of the opposing sidewalls, wherein the top electrode via directly contacts the opposing sidewalls and the upper surface of the protective sidewall spacer layer.

13. The integrated chip of claim 9, wherein a maximum width of the top electrode is less than the minimum width of the top electrode via, and wherein a maximum width of the bottom electrode is greater than a maximum width of the top electrode via.

14. The integrated chip of claim 9, further comprising:
an interconnect wire overlying the top electrode via, wherein the top electrode via is laterally spaced between sidewalls of the interconnect wire, and wherein the interconnect wire and the top electrode via are a continuous conductive structure.

15. The integrated chip of claim 14, wherein the continuous conductive structure comprises a conductive liner disposed along a perimeter of a conductive body, wherein the conductive liner comprises tungsten and the conductive body comprises aluminum or copper.

16. An integrated chip, comprising:
a substrate;
a magnetoresistive random access memory (MRAM) cell disposed over the substrate, wherein the MRAM cell comprises a magnetic tunnel junction (MTJ) sandwiched between a bottom electrode and a top electrode;
a top electrode via overlying the top electrode;
a first sidewall spacer layer continuously extending along a sidewall of the MTJ and a sidewall of the top electrode;
a second sidewall spacer layer laterally enclosing the first sidewall spacer layer, wherein a top surface of the second sidewall spacer layer is disposed below a top surface of the first sidewall spacer layer; and
a protective sidewall spacer layer disposed between the first and second sidewall spacer layers, wherein the protective sidewall spacer layer comprises a first lateral segment, a curved vertical segment, and a second lateral segment underlying the first lateral segment, wherein the curved vertical segment continuously extends from the first lateral segment to the second lateral segment, wherein the first lateral segment contacts the sidewall of the top electrode and is spaced between a lower surface of the top electrode via and the top surface of the first sidewall spacer layer.

17. The integrated chip of claim 16, wherein a top surface of the first lateral segment is aligned with an upper edge of the top electrode.

18. The integrated chip of claim 16, wherein the top electrode via continuously extends from an inner sidewall of the second sidewall spacer layer, along an outer surface of the curved vertical segment, to a top surface of the first lateral segment.

19. The integrated chip of claim 16, wherein outermost sidewalls of the protective sidewall spacer layer and outermost sidewalls of the bottom electrode are aligned.

20. The integrated chip of claim 16, wherein the second lateral segment continuously extends along and directly contacts a top surface of the bottom electrode.

* * * * *